(12) United States Patent
Veerasamy et al.

(10) Patent No.: US 6,416,816 B2
(45) Date of Patent: Jul. 9, 2002

(54) METHOD OF DEPOSITION DLC INCLUSIVE LAYER(S) USING HYDROCARBON AND/OR SILOXANE GAS(ES)

(75) Inventors: Vijayen S. Veerasamy, Farmington Hills; Rudolph Hugo Petrmichl, Ann Arbor; Scott V. Thomsen, Milford, all of MI (US)

(73) Assignee: Guardian Industries Corp., Auburn Hills, MI (US)

( * ) Notice: Subject to any disclaimer, the term of this patent is extended or adjusted under 35 U.S.C. 154(b) by 17 days.

(21) Appl. No.: 09/877,098

(22) Filed: Jun. 11, 2001

Related U.S. Application Data

(60) Division of application No. 09/657,132, filed on Sep. 7, 2000, now Pat. No. 6,277,480, which is a continuation-in-part of application No. 09/627,441, filed on Jul. 28, 2000, now Pat. No. 6,280,834, and a continuation-in-part of application No. 09/617,815, filed on Jul. 17, 2000, now Pat. No. 6,261,693, and a continuation-in-part of application No. 09/583,862, filed on Jun. 1, 2000, and a continuation-in-part of application No. 09/442,805, filed on Nov. 18, 1999, and a continuation-in-part of application No. 09/303,548, filed on May 3, 1999, now Pat. No. 6,261,693.

(51) Int. Cl.[7] ............................................. C23C 16/26
(52) U.S. Cl. ............................ 427/249.7; 427/249.15; 427/255.7; 427/162; 427/165
(58) Field of Search ....................... 427/249.7, 249.15, 427/255.7, 419.7, 162, 165

(56) References Cited

U.S. PATENT DOCUMENTS 3,959,577 A 5/1976 Frink
4,263,350 A 4/1981 Valimont
4,400,410 A 8/1983 Green et al.

(List continued on next page.)

OTHER PUBLICATIONS

US 4,960,645, 10/1990, Lingle et al. (withdrawn)
"Highly Tetrahedral, Diamond–Like Amorphous Hydrogenated Carbon Prepared from a Plasma Beam Source", Weiler et al., May 1994, No. 21, pp. 2797–2799.
"Deposition of Carbon Films by a Filtered Cathodic Arc", Kuhn et al., Aug. 1993, No. 10, pp. 1350–1354.
"Optical and Electronic Properties of Amorphous Diamond", Veerasamy et al., Apr. 1993, Nos. 5/7, pp. 782–787.
"Preparation and Properties of highly Tetrahedral Hydrogenated Amorphous Carbon", Weiler et al., Jan. 1996, vol. 53, No. 3, pp. 1594–1607.
"Surface Hardening of Ceramic and Glass Materials", vol. 36, No. 3, Mar. 1993, p. 297.
"Surface Hardening of Ceramic and Glass Materials", vol. 35, No. 1, Jan. 1993, p. 225.
"Electronic Density of States In Highly Tetrahedral Amorphous Carbon", Veerasamy et al., Apr. 1993, vol. 37, No. 2, pp. 319–326.

*Primary Examiner*—Bret Chen
(74) *Attorney, Agent, or Firm*—Nixon & Vanderhye P.C.

(57) ABSTRACT

A substrate is coated with a coating system including at least one diamond-like carbon (DLC) inclusive layer. In certain embodiments, the coating system includes an anti-reflective layer, a DLC inclusive layer provided for hardness/durability purposes, a primer layer, and an FAS inclusive hydrophobic layer provided over the primer layer. The anti-reflective layer is provided in order to reduce visible light reflections off of the resulting coated article and thus to improve visible transmission of the article. In certain embodiments, the primer layer may be provided in order to enable improved adhesion between the FAS inclusive layer and the DLC inclusive layer that is provided for hardness/durability. In certain embodiments, each of the anti-reflective layer, the DLC inclusive layer, and/or the primer layer may include DLC for purposes described herein. In certain alternative embodiments, the primer and FAS layers need not be provided.

18 Claims, 9 Drawing Sheets

U.S. PATENT DOCUMENTS

| | | | |
|---|---|---|---|
| 4,495,263 A | 1/1985 | Vandervalk | |
| RE32,272 E | 10/1986 | Funaki et al. | |
| 4,666,802 A | 5/1987 | Hung et al. | |
| 4,746,538 A | 5/1988 | Mackowski | |
| 4,777,090 A | 10/1988 | Cushinsky et al. | |
| 4,816,291 A | 3/1989 | Desphandey et al. | |
| 4,877,677 A | 10/1989 | Hirochi et al. | |
| 4,965,156 A | 10/1990 | Hotonu et al. | |
| 5,000,831 A | 3/1991 | Osawa et al. | |
| 5,098,737 A | 3/1992 | Collins et al. | |
| 5,122,249 A | 6/1992 | Niemann et al. | |
| 5,135,808 A | 8/1992 | Kimock et al. | |
| 5,143,963 A | 9/1992 | Sterling et al. | |
| 5,188,887 A | 2/1993 | Linge et al. | |
| 5,190,807 A | 3/1993 | Kimock et al. | |
| 5,198,263 A * | 3/1993 | Stafford et al. | 427/577 |
| 5,214,008 A | 5/1993 | Beckwith et al. | |
| 5,229,194 A | 7/1993 | Lingle et al. | |
| 5,240,886 A | 8/1993 | Gülotta et al. | |
| 5,242,560 A | 9/1993 | Lingle et al. | |
| 5,250,322 A | 10/1993 | Takahashi et al. | |
| 5,268,217 A | 12/1993 | Kimock et al. | |
| 5,294,252 A | 3/1994 | Gun | |
| 5,298,048 A | 3/1994 | Lingle et al. | |
| 5,328,768 A | 7/1994 | Goodwin | |
| 5,344,718 A | 9/1994 | Hartig et al. | |
| 5,352,493 A | 10/1994 | Dorfman et al. | |
| 5,376,455 A | 12/1994 | Hartig et al. | |
| 5,378,527 A | 1/1995 | Nakanishi et al. | |
| 5,385,872 A | 1/1995 | Gulotta et al. | |
| 5,401,316 A | 3/1995 | Shiraishi et al. | |
| 5,415,297 A | 5/1995 | Hirayama et al. | |
| 5,415,927 A | 5/1995 | Hirayama et al. | |
| 5,425,861 A | 6/1995 | Hartig et al. | |
| 5,425,983 A | 6/1995 | Propst et al. | |
| 5,435,900 A | 7/1995 | Gorokhovsky | |
| 5,437,894 A | 8/1995 | Ogawa et al. | |
| 5,455,081 A | 10/1995 | Okada et al. | |
| 5,474,816 A | 12/1995 | Falabella | |
| 5,506,038 A | 4/1996 | Knapp et al. | |
| 5,507,987 A | 4/1996 | Windischmann | |
| 5,508,092 A | 4/1996 | Kimock et al. | |
| 5,508,368 A | 4/1996 | Knapp et al. | |
| 5,510,186 A * | 4/1996 | Sulzbach | 428/408 |
| 5,514,476 A | 5/1996 | Hartig et al. | |
| 5,518,780 A | 5/1996 | Tamor et al. | |
| 5,527,559 A | 6/1996 | Simpson | |
| 5,527,596 A | 6/1996 | Kimock et al. | |
| 5,547,714 A | 8/1996 | Huck et al. | |
| 5,557,462 A | 9/1996 | Hartig et al. | |
| 5,569,501 A * | 10/1996 | Bailey et al. | 427/577 |
| 5,580,605 A | 12/1996 | Ogawa et al. | |
| 5,612,262 A | 3/1997 | Kloss et al. | |
| 5,614,574 A | 3/1997 | Sheth | |
| 5,616,179 A | 4/1997 | Baldwin et al. | |
| 5,620,745 A | 4/1997 | Simpson | |
| 5,624,718 A | 4/1997 | Dearnaley | |
| 5,629,532 A | 5/1997 | Myrick | |
| 5,635,245 A | 6/1997 | Kimock et al. | |
| 5,635,258 A | 6/1997 | Chen et al. | |
| 5,637,353 A | 6/1997 | Kimock et al. | |
| 5,643,423 A | 7/1997 | Kimock et al. | |
| 5,653,812 A | 8/1997 | Petrmichl et al. | |
| 5,679,269 A | 10/1997 | Cohen et al. | |
| 5,679,413 A * | 10/1997 | Petrmichl et al. | 427/527 |
| 5,679,446 A | 10/1997 | Windischmann | |
| 5,688,585 A | 11/1997 | Lingle et al. | |
| 5,688,864 A | 11/1997 | Goodwin | |
| 5,707,409 A * | 1/1998 | Martin et al. | 427/380 |
| 5,718,976 A | 2/1998 | Dorfman et al. | |
| 5,731,046 A | 3/1998 | Mistry et al. | |
| 5,736,476 A | 4/1998 | Watzke et al. | |
| 5,747,118 A | 5/1998 | Bunshah et al. | |
| 5,762,715 A | 6/1998 | Patten, Jr. et al. | |
| 5,770,321 A | 6/1998 | Hartig et al. | |
| 5,776,553 A | 7/1998 | Jaffe et al. | |
| 5,776,600 A | 7/1998 | Katayama et al. | |
| 5,776,603 A | 7/1998 | Zagdoun et al. | |
| 5,776,612 A | 7/1998 | Fisher | |
| 5,776,845 A | 7/1998 | Boulos et al. | |
| 5,776,846 A | 7/1998 | Sakaguchi et al. | |
| 5,783,260 A | 7/1998 | Kato et al. | |
| 5,783,309 A | 7/1998 | Faure et al. | |
| 5,792,254 A | 8/1998 | Windischmann | |
| 5,795,648 A | 8/1998 | Goel et al. | |
| 5,798,139 A | 8/1998 | Nagashima et al. | |
| 5,800,918 A | 9/1998 | Chartier et al. | |
| 5,800,933 A | 9/1998 | Hartig et al. | |
| 5,824,374 A | 10/1998 | Bradley, Jr. et al. | |
| 5,830,332 A | 11/1998 | Babich et al. | |
| 5,830,812 A | 11/1998 | Shelestak et al. | |
| 5,837,108 A | 11/1998 | Lingle et al. | |
| 5,837,357 A | 11/1998 | Matsuo et al. | |
| 5,844,225 A | 12/1998 | Kimock et al. | |
| 5,846,613 A | 12/1998 | Neuville | |
| 5,846,649 A | 12/1998 | Knapp et al. | |
| 5,849,228 A | 12/1998 | Patton, Jr. et al. | |
| 5,849,413 A | 12/1998 | Zhu et al. | |
| 5,851,940 A | 12/1998 | Boulos et al. | |
| 5,855,641 A | 1/1999 | Taniguchi | |
| 5,856,016 A | 1/1999 | Takahashi et al. | |
| 5,858,477 A | 1/1999 | Veerasamy et al. | |
| 5,858,894 A | 1/1999 | Nagashima et al. | |
| 5,858,896 A | 1/1999 | Nagashima et al. | |
| 5,863,605 A | 1/1999 | Bak-Boychuk et al. | |
| 5,873,921 A | 2/1999 | Hiroth et al. | |
| 5,876,753 A | 3/1999 | Timmons et al. | |
| 5,877,103 A | 3/1999 | Dupont et al. | |
| 5,879,775 A | 3/1999 | Walter et al. | |
| 5,880,552 A | 3/1999 | McGill et al. | |
| 5,888,593 A | 3/1999 | Petrmichl et al. | |
| 5,900,342 A | 5/1999 | Visser et al. | |
| 5,939,140 A | 8/1999 | Jang et al. | |
| 5,958,601 A | 9/1999 | Salsman | |
| 5,958,996 A | 9/1999 | Egitto et al. | |
| 5,965,216 A | 10/1999 | Neuberger et al. | |
| 5,965,629 A | 10/1999 | Jung et al. | |
| 5,989,693 A * | 11/1999 | Yamasaki et al. | 428/408 |
| 5,997,943 A | 12/1999 | Azzopardi et al. | |
| 6,001,431 A | 12/1999 | Itoh et al. | |
| 6,002,208 A | 12/1999 | Maishev et al. | |
| 6,046,758 A | 4/2000 | Brown et al. | |
| 6,086,796 A * | 7/2000 | Brown et al. | 428/64.1 |
| 6,261,424 B1 | 7/2001 | Goncharenko et al. | |
| 6,277,480 B1 | 8/2001 | Veerasamy et al. | |
| 6,280,834 B1 | 8/2001 | Veerasamy et al. | |
| 6,284,377 B1 | 9/2001 | Veerasamy | |
| 6,303,225 B1 | 10/2001 | Veerasamy | |
| 6,303,226 B2 | 10/2001 | Veerasamy | |

* cited by examiner

HMDSO
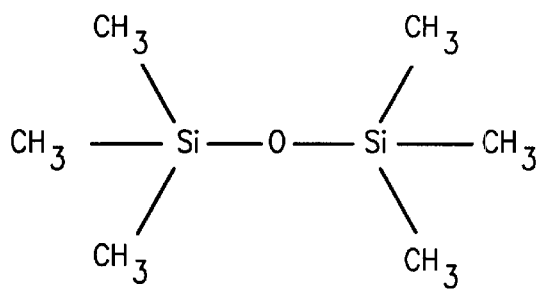
FIG. 9
FIG. 10
DMS
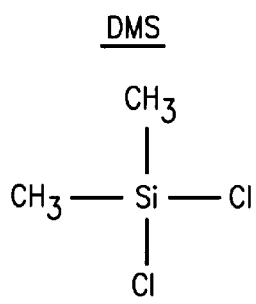
FIG. 11
TMS
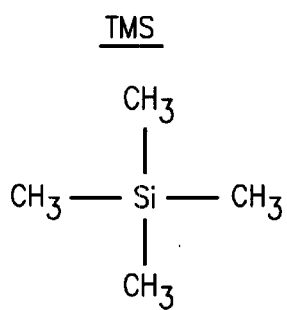
FIG. 12
3MS
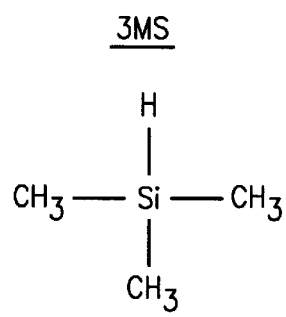
FIG. 13
OMCTSO
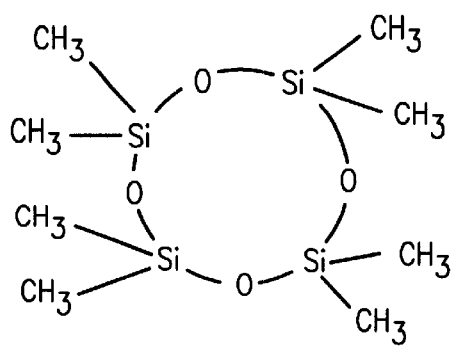

TMDSO

TEOS

METHOD OF DEPOSITION DLC INCLUSIVE LAYER(S) USING HYDROCARBON AND/OR SILOXANE GAS(ES)

This application is a division of application Ser. No. 09/657,132, filed Sep. 7, 2000, now U.S. Pat. No. 6,277,480 which is a continuation-in-part of Ser. No. 09/627,441, filed Jul. 28, 2000 now U.S. Pat. No. 6,280,834 and a continuation-in-part of Ser. No. 09/617,815, filed Jul. 17, 2000 now U.S. Pat. No. 6,261,693 and a continuation-in-part of Ser. No. 09/303,548 now U.S. Pat. No. 6,261,693 filed May 3, 1999 and a continuation-in-part of Ser. No. 09/442, 805, filed Nov. 18, 1999 and a continuation-in-part of Ser. No. 09/583,862, filed Jun. 1, 2000, the entire content of which is hereby incorporated by reference in this application.

This invention relates to a coated article including at least one diamond-like carbon (DLC) inclusive layer and at least one layer deposited using a siloxane and/or oxygen (O) inclusive organosilicon compound gas (e.g., hexamethyldisiloxane gas which may be abbreviated herein as HMDSO) provided on (directly or indirectly) a substrate of glass, plastic, ceramic, or the like, and a corresponding method of making the same.

BACKGROUND OF THE INVENTION

It is known to deposit diamond-like carbon (DLC) coatings on a substrate. Unfortunately, DLC becomes dark in color and absorbs visible light rays at high thicknesses. DLC may even absorb some visible light at small thicknesses.

There exists a need in the art to coat articles such as vehicle windows/windshields, architectural glass, etc. with DLC in order to make such articles more scratch resistant and durable. However, such articles may often be used in environments (e.g., vehicle windshields, vehicle windows, etc.) where high visible light transmission (i.e., low visible light reflection and/or absorption) is desirable. Thus, there exists a need in the art to provide a coated article including at least one DLC inclusive layer(s) thereon for durability purposes which at the same time can experience sufficiently high visible light transmittance and/or low visible light reflectance if same is desired.

Certain of the aforesaid parent applications discuss the use of a TMS gas to form a DLC inclusive layer disposed between a glass substrate and another DLC inclusive layer deposited via at least acetylene gas. While such articles have many desirable characteristics and function very well, the use of TMS gas to form the layer between the other DLC inclusive layer and a glass substrate has been found to lead to a resulting article experiencing more visible light reflection than would otherwise be desired. The refractive index "n" of glass is about 1.57, while the refractive index "n" of DLC deposited via acetylene gas is about 2.0 in the visible range. A layer deposited using TMS gas typically has a refractive index "n" of about 1.9 to 2.0. As a result of the rather high refractive index "n" of such a TMS layer, the resulting article tends to experience more visible light reflection than would otherwise be desired in certain circumstances.

In view of the above, it is apparent that there exists a need in the art for a coated article including at least one DLC inclusive layer that has good visible transmission characteristics, and a corresponding method of making the same. There also exists a need in the art for a layer which can be deposited directly between a glass substrate and a DLC inclusive layer that more closely matches or couples the respective refractive indices of the glass and DLC in order to reduce visible reflection(s) off of the resulting coated article. Thus, there further exists a need in the art for a layer having a refractive index "n" of from about 1.4 to 2.0 (more preferably from about 1.5 to 1.8) that is compatible with DLC and glass which may be disposed between a DLC inclusive layer and a glass substrate, which can limit visible light reflection off of a resulting coated article and simultaneously can provide a good bond between the DLC and glass.

It has also been found that under certain circumstances hydrophobic layers such as fluoro-alkyl silane (FAS) inclusive layers have trouble bonding directly to hard DLC inclusive layers deposited using acetylene gas. Thus, there also exists a need in the art for a DLC inclusive hydrophobic coating system including a primer layer for improving bonding between an overlying hydrophobic layer and an underlying DLC inclusive layer.

It is a purpose of different embodiments of this invention to fulfill any and/or all of the above described needs in the art, and/or other needs which will become apparent to the skilled artisan once given the following disclosure.

SUMMARY OF THE INVENTION

In certain embodiments of this invention, a coated article includes an oxygen (O) and/or silicon (Si) inclusive anti-reflection layer disposed between a glass substrate and a diamond-like carbon (DLC) inclusive layer. The presence of oxygen and/or silicon in the anti-reflective layer tends to lower the refractive index "n" (visible) so as to be within the range of from about 1.4 to 2.0 (more preferably from about 1.5 to 1.9, and most preferably from about 1.5 to 1.8), and also enables good bonding with both the DLC inclusive layer(s) and the glass substrate. The anti-reflective index "n" (visible) matching/coupling layer enables visible reflection off of the resulting coated article to be reduced. In certain exemplary embodiments, the anti-reflective and/or index matching/coupling layer may include at least some DLC to improve bonding and/or durability characteristics of the resulting coated article.

According to an exemplary method of making such a coated article, at least a siloxane gas (e.g., HMDSO, OMCTSO, TMDSO, TEOS, etc.) is utilized in order to deposit the anti-reflective layer(s). According to certain embodiments, at least an oxygen (O) inclusive organosilicon (this phrase including siloxanes and other oxygen inclusive organosilicon compounds) compound inclusive gas may be used to deposit the antireflective layer(s).

In certain embodiments, an oxide inclusive primer layer (s) may be provided over the DLC inclusive layer(s) and a hydrophobic layer (e.g., FAS inclusive layer) may be provided over the primer layer(s). The primer layer(s) may include or be of, for example, any of the aforesaid materials that may be used for the index matching layer and thus may be DLC inclusive in certain embodiments. Alternatively, the primer layer(s) may instead be of or include an oxide such as titanium oxide ($TiO_x$), silicon oxide ($SiO_x$), $HfO_x$, $VO_x$, any combination thereof, or any other suitable oxide material having any desired stoichiometry.

Coated articles made according to certain embodiments of this invention may be hydrophobic (e.g., shed water), while coated articles made according to other embodiments of this invention need not be hydrophobic. In hydrophobic embodiments, an object of this invention is to provide a durable coated article that can shed or repel water (e.g. automotive windshield, automotive backlite, automotive side window, architectural window, bathroom shower glass, residential window, bathroom shower door, coated ceramic article/tile, etc.). In one exemplary hydrophobic embodiment, a coating system includes each of DLC and FAS, the DLC being provided for at least durability purposes and the FAS for increasing the contact angle of the coating system.

In certain embodiments of this invention, an object of this invention is to provide a coated substrate having a coating system including $sp^3$ carbon-carbon bonds and an adhesion energy (or wettability) W with regard to water of less than or equal to about 23 mN/m, more preferably less than or equal to about 21 mN/m, even more preferably less than or equal to about 20 mN/m, and in most preferred embodiments less than or equal to about 19 mN/meter in order to provide hydrophobicity. This can also be explained or measured in energy per unit area ($mJ/m^2$). Another exemplary object is to provide a coating system having a surface energy $\gamma_c$ (on the surface of the coated article) of less than or equal to about 20.2 mN/m, more preferably less than or equal to about 19.5 mN/m, and most preferably less than or equal to about 18 mN/m in order to provide hydrophobicity.

In hydrophobic embodiments, an object of this invention is to provide a coated substrate, wherein a DLC inclusive coating system has an initial (i.e. prior to being exposed to environmental tests, rubbing tests, acid tests, UV tests, or the like) water contact angle θ of at least about 80 degrees, more preferably of at least about 100 degrees, even more preferably of at least about 110 degrees, and most preferably of at least about 125 degrees.

Another object of this invention is to manufacture a coated article wherein the temperature of an underlying glass substrate may be less than about 200° C., preferably less than about 150° C., most preferably less than about 80° C., during the deposition of a DLC inclusive coating system. This reduces graphitization during the deposition process, as well as reduces detempering and/or damage to low-E and/or IR-reflective coatings already on the substrate in certain embodiments.

Yet another object of this invention is to fulfill any and/or all of the aforesaid objects and/or needs.

This invention will now be described with respect to certain embodiments thereof, along with reference to the accompanying illustrations.

IN THE DRAWINGS

Figure 1A:
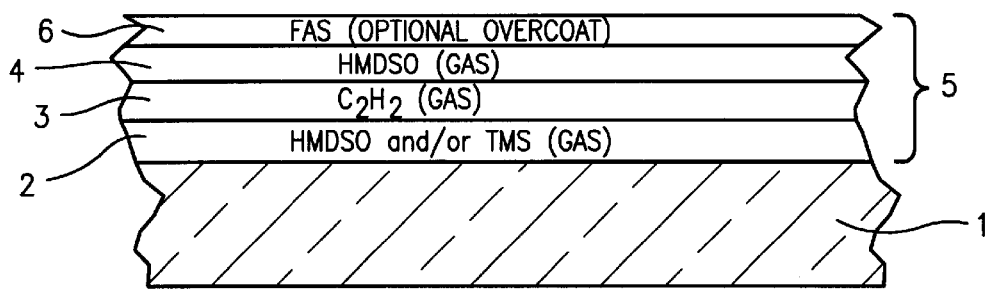
FIG. 1(a) is a schematic side cross sectional view illustrating exemplary gases used in depositing a plurality of layers on a substrate in accordance with an embodiment of this invention.
Figure 1B:
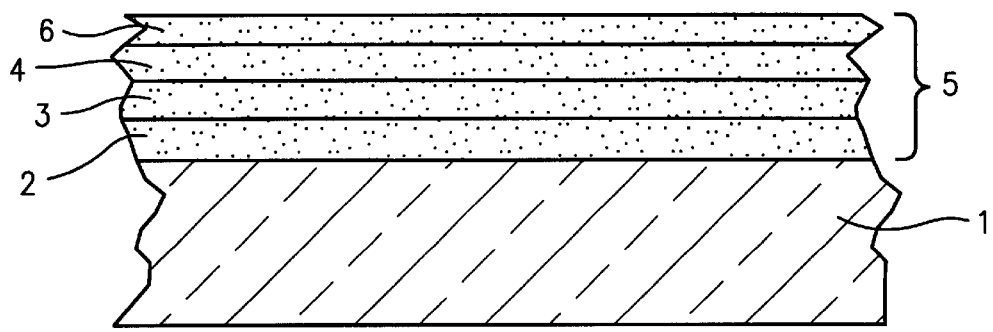
FIG. 1(b) is a side cross sectional view of a coated article resulting from the use of the gases of FIG. 1(a) during the article manufacturing process.
Figure 1C:
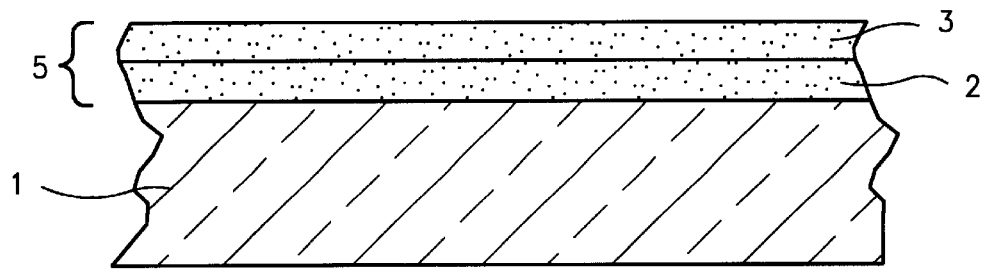

FIG. 1c) is a side cross sectional view of a coated article according to another embodiment of this invention, that is similar to the embodiment of FIGS. 1(a)-(b) except that layers 4 and 6 are not included in this embodiment.

Figure 2:
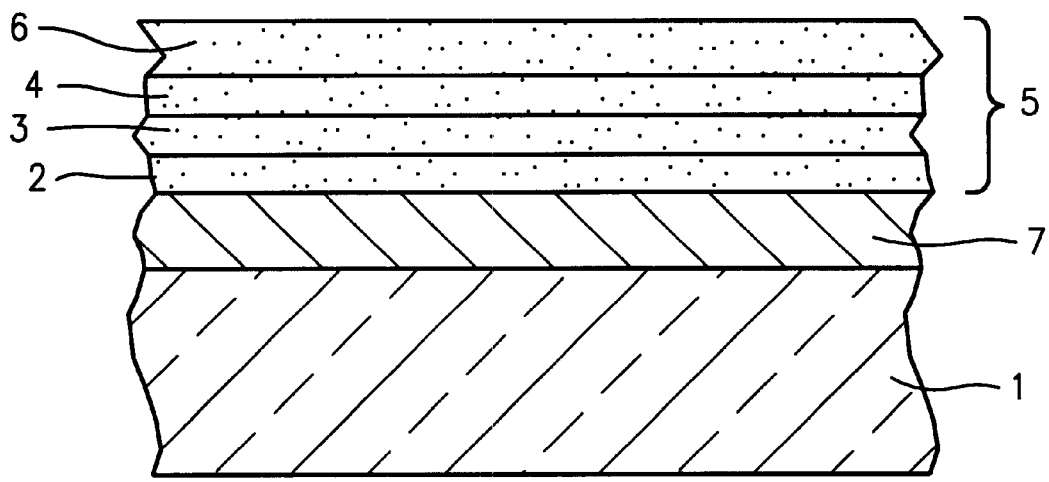

FIG. 2 is a side cross sectional view of a coated article according to another embodiment of this invention, wherein the DLC and FAS inclusive coating(s) or coating system of FIG. 1(b) is provided over an intermediate layer(s).

Figure 3:
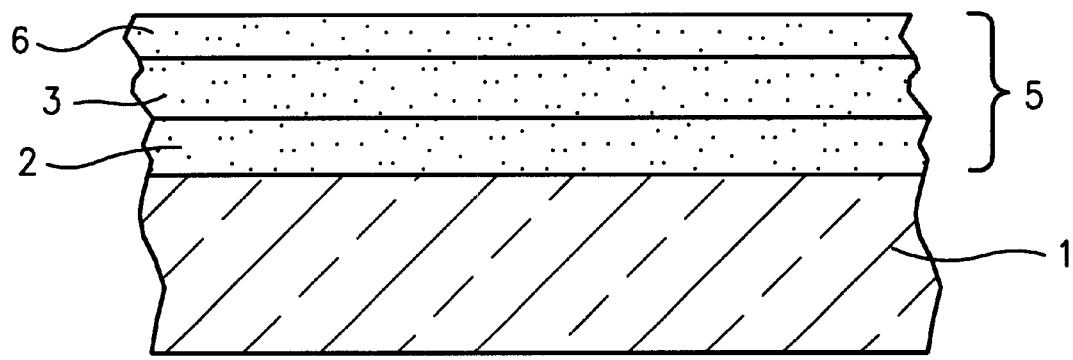

FIG. 3 is a side cross sectional view of a coated article according to another embodiment of this invention.

Figure 4A:
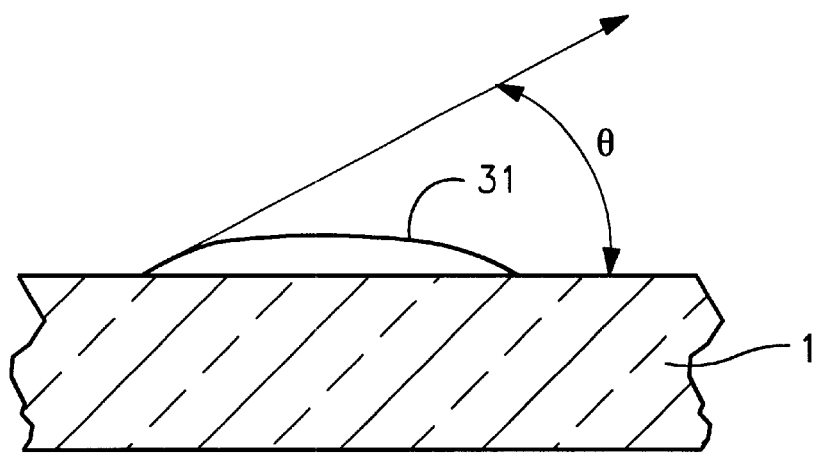

FIG. 4(a) is a side cross sectional partially schematic view illustrating a low contact angle θ of a water drop on a glass substrate.

Figure 4B:
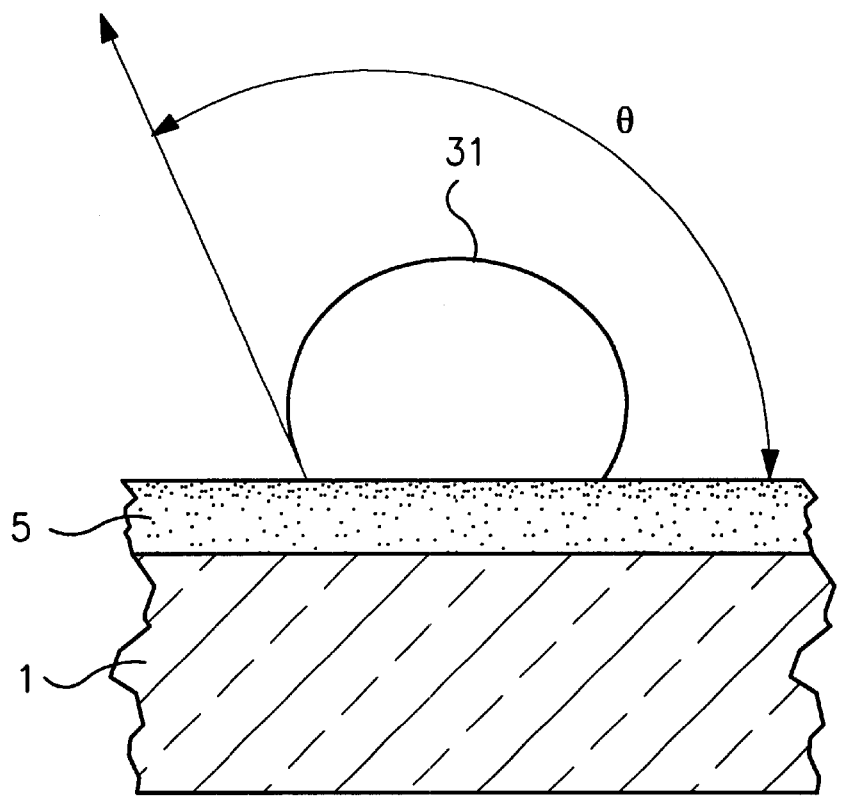

FIG. 4(b) is a side cross sectional partially schematic view illustrating the coated article of any of the FIGS. 1-3 embodiments of this invention and the contact angle θ of a water drop thereon (when hydrophobicity is desired).

Figure 5:
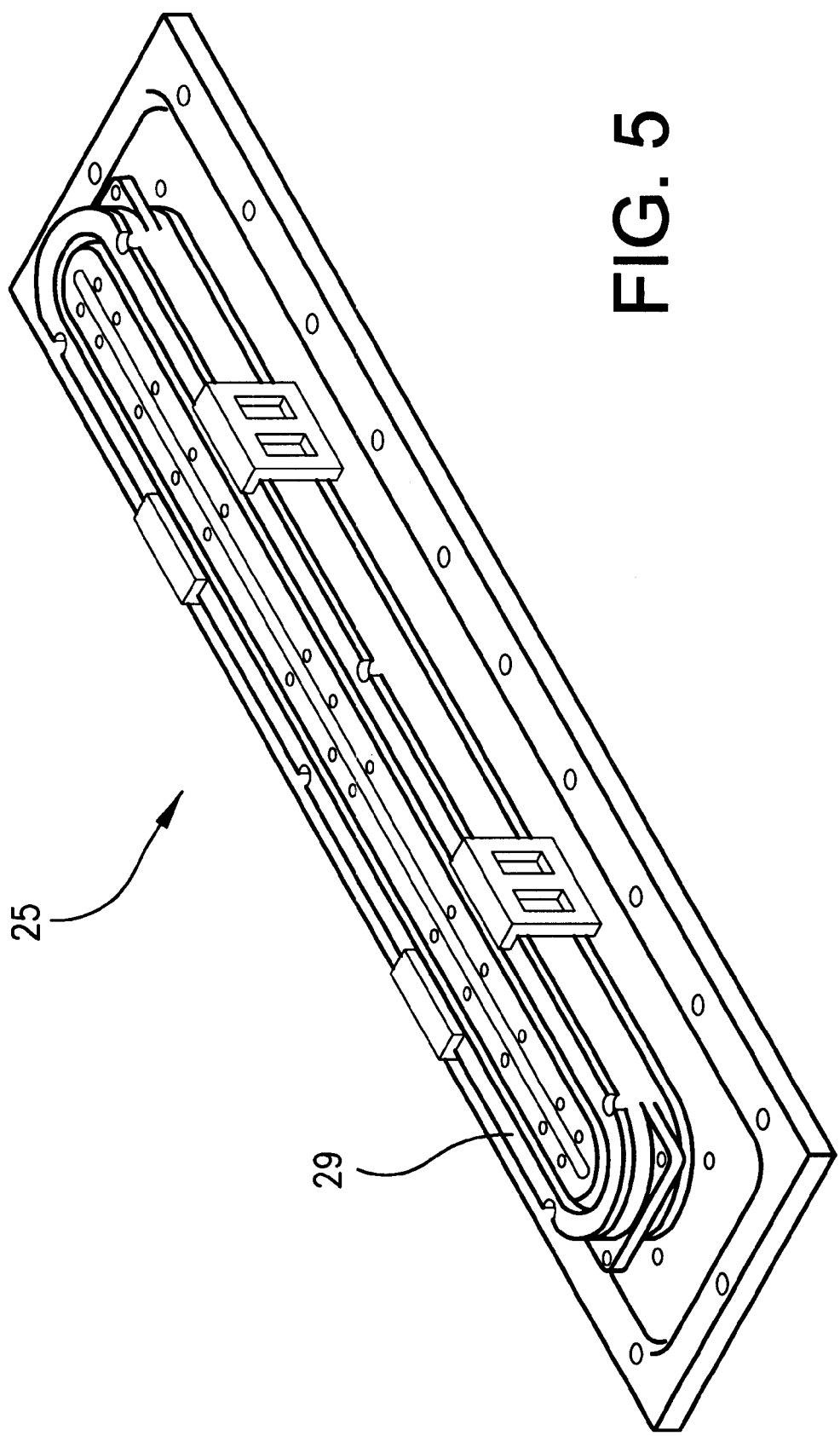

FIG. 5 is a perspective view of a linear ion beam source which may be used in any embodiment of this invention for depositing DLC inclusive layer(s) and siloxane gas-deposited layer(s).

Figure 6:
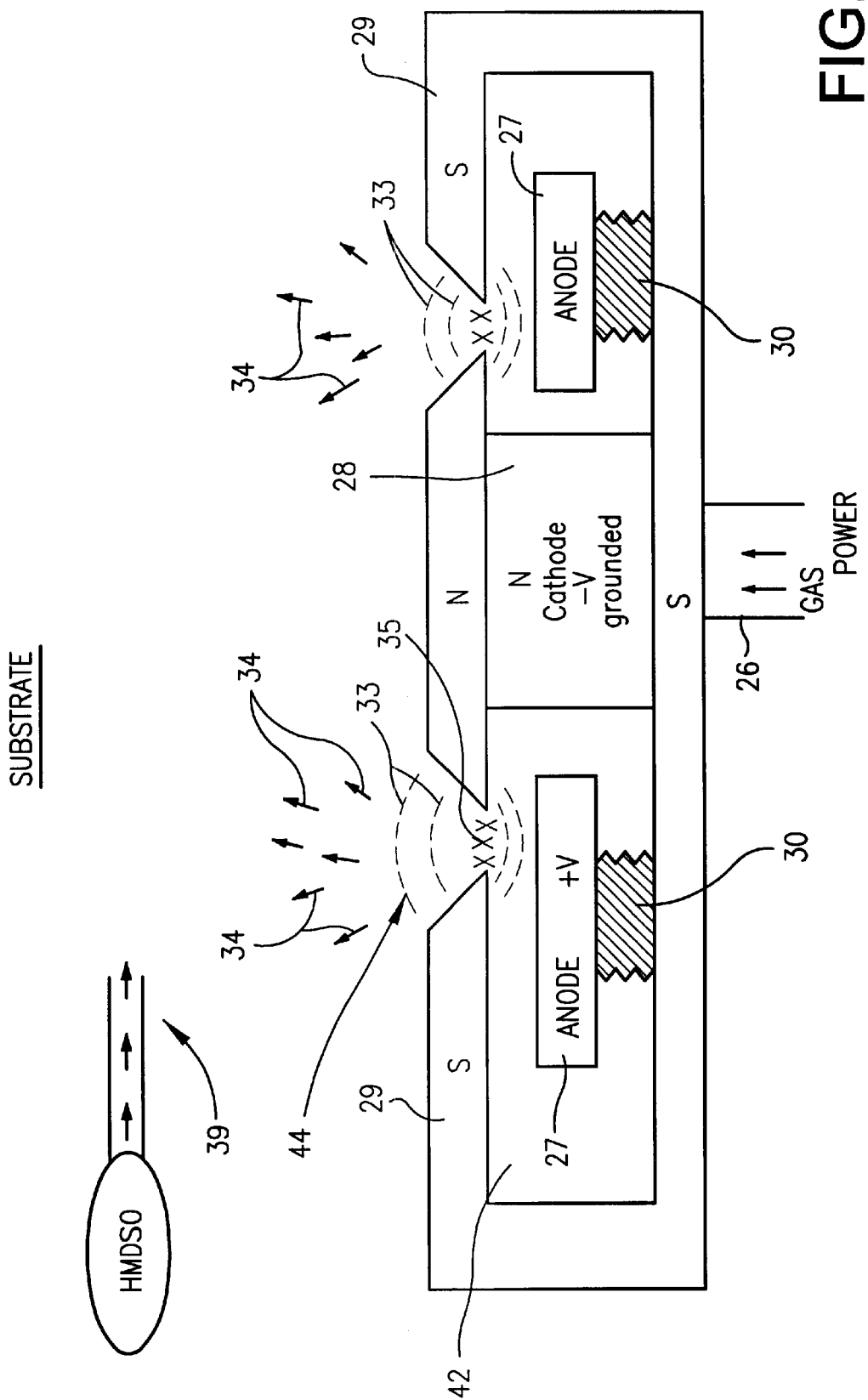

FIG. 6 is a cross sectional view of the linear ion beam source of FIG. 5.

Figure 7:
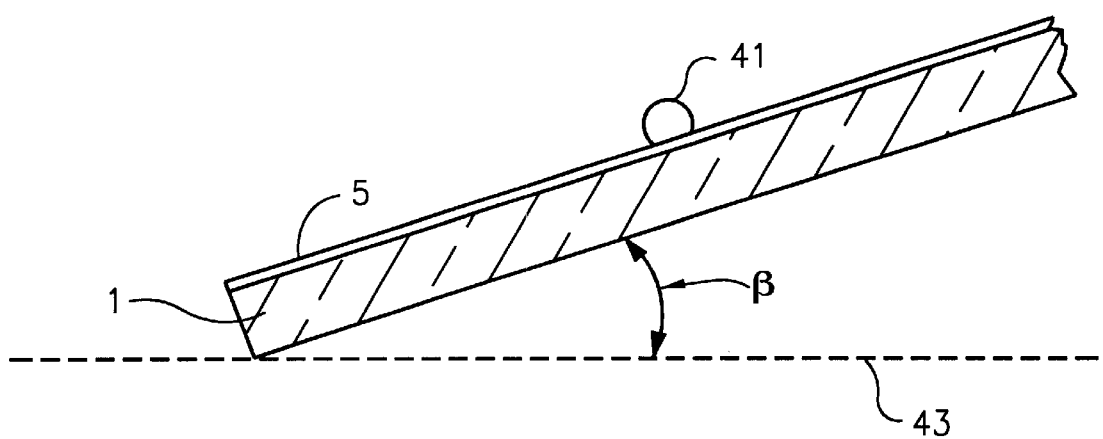

FIG. 7 is a diagram illustrating tilt angle as discussed herein in accordance with certain embodiments of this invention.

Figure 8:
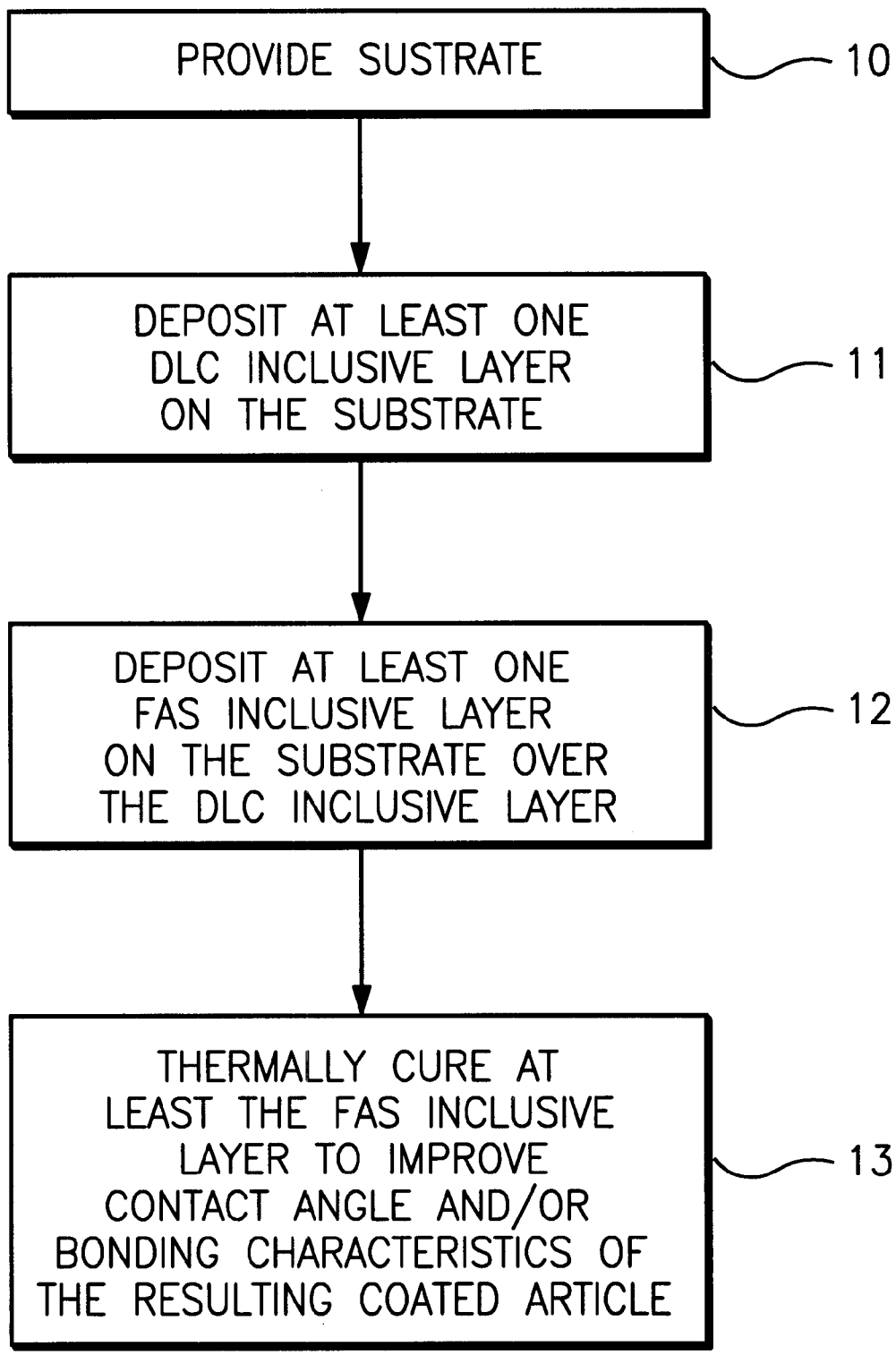

FIG. 8 is a flowchart illustrating certain steps taken according to an exemplary embodiment of this invention, in exemplary embodiments where the optional FAS inclusive hydrophobic layer is thermally cured after being deposited on the substrate.

FIG. 9 illustrates a chemical structure of exemplary HMDSO.

FIG. 10 illustrates a chemical structure of exemplary DMS.

FIG. 11 illustrates a chemical structure of exemplary TMS.

FIG. 12 illustrates a chemical structure of exemplary 3MS.

FIG. 13 illustrates a chemical structure of exemplary OMCTSO.

Figure 14:
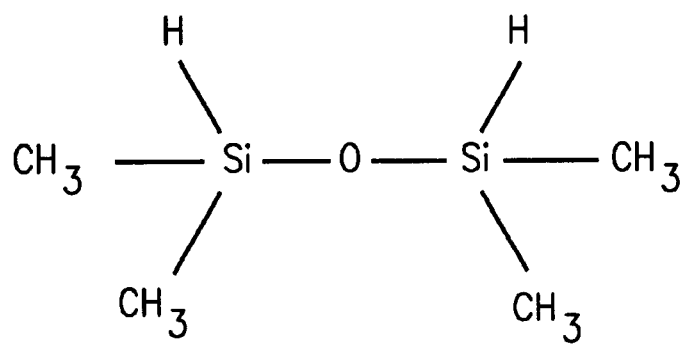

FIG. 14 illustrates a chemical structure of exemplary TMDSO.

Figure 15:
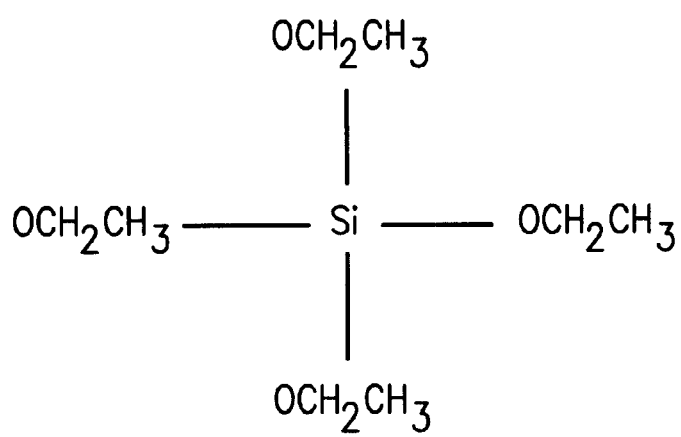

FIG. 15 illustrates a chemical structure of exemplary TEOS.

DETAILED DESCRIPTION OF CERTAIN EMBODIMENTS OF THIS INVENTION

Referring now more particularly to the accompanying drawings in which like reference numerals indicate like elements throughout the accompanying views.

An object of this invention is to provide a method of making a coated article having a durable light transmissive (e.g., transmissive to at least about 60% of visible light rays, more preferably at least about 70%) coating system thereon. An anti-reflective refractive index "n" matching/coupling layer is provided between (either directly or indirectly) the substrate and a hard DLC inclusive layer in order to reduce visible light reflections off of the coated article thereby improving transmission characteristics of the coated article. The anti-reflective layer also provides good bonding of the DLC inclusive layer to the substrate so as to enable the resulting coated article to have good mechanical and/or chemical durability. In order to manufacture such a coated article with a suitable anti-reflective layer and bonding characteristics, a siloxane and/or oxygen inclusive organo-silicon gas may be used during the deposition process of the anti-reflective index matching/coupling layer. Thus, in certain preferred embodiments, the anti-reflective index matching layer includes DLC, although it need not be as hard as the DLC inclusive layer over top of it.

FIGS. 1(a) and 1(b) are side cross sectional views of a coated article according to an embodiment of this invention, wherein a diamond-like carbon (DLC) and fluoro-alkyl silane (FAS) inclusive coating system 5 including layers 2, 3, 4 and 6 is provided on substrate 1. Substrate 1 may be of glass, plastic, ceramic, or the like. FIG. 1(a) illustrates exemplary gases (e.g., HMDSO and $C_2H_2$ (acetylene)) which may be used in the deposition of layers 2–4, while FIG. 1(b) illustrates the resulting coated article including the final resulting layers 2–4, 6 provided on substrate 1.

DLC inclusive layer 3 (e.g., having an index of refraction "n" of approximately 1.9 to 2.2, most preferably about 2.0) is provided on the substrate 1 for scratch resistance and/or durability (e.g., mechanical and/or chemical durability) purposes in order to protect the underlying substrate 1 from scratches, corrosion, and the like. Anti-reflective index matching layer 2 is located between substrate 1 and DLC inclusive layer 3 in order to couple or approximately match the respective indices of refraction of DLC inclusive layer 3 and substrate 1. Anit-reflective layer 2 serves the purposes of enabling visible light reflectance off of the article to be reduced, thereby improving transmittance of the coated article. Layer 2 may be located directly between DLC inclusive layer 3 and substrate 1 so as to contact both of them in certain embodiments, or alternatively other layer(s) may be located between index matching layer 2 and one/both of substrate 1 and layer 3. Anti-reflective layer 2 may be referred to herein as an "index matching" layer when it has an index of refraction "n" of a value between the respective indices "n" of substrate 1 and layer 3.

Thus, the term "between" as used herein simply means that a primary layer being referred to is located at some position between two other layers regardless of whether they are in direct contact (i.e., other layer(s) may also be located between the other layers, in addition to the primary layer). For example, if a first layer is referred to herein as being located "between" second and third layers, then the first layer may or may not be in direct contact with the second and third layers (e.g., fourth and fifth layers may be located between the first and third layers). Likewise, the term "on" herein means both directly on and indirectly on. For example, if a first layer is "on" a substrate herein, the first layer may be directly on (contacting) the substrate or alternatively additional layer(s) may be located between the first layer and the substrate.

Layers 4 and 6 are optional and need not be provided in all embodiments of this invention. When provided, primer layer 4 serves to improve bonding between FAS inclusive hydrophobic layer 6 and DLC inclusive layer 3. FAS inclusive layer is provided for hydrophobic purposes, although hydrophobicity may be achieved absent FAS inclusive layer 6 in certain embodiments of this invention. As layers 4 and 6 are optional, coating system 5 may be made up of, for example, (i) layers 2, 3 only, (ii) layers 2-4 only, (iii) layers 2, 3 and 6 only, (iv) layers 2, 3, 4 and 6 only, (v) layers 2, 3, 4 and 6 with other non-illustrated layer(s) overlying the same, underlying the same, or intermingled within or between any of layers 2, 3, 4 and/or 6, (vi) layers 2 and 3 along with other non-illustrated layers, (vii) layers 2–4 along with other non-illustrated layers, and so on. The point here is that other layers may be provided on substrate 1 (other than those illustrated in FIGS. 1(a) and 1(b)) according to different embodiments of this invention.

Starting from the substrate moving outwardly, anti-reflective layer 2 is first deposited on substrate 1. Layer 2 may be deposited directly on substrate 1 so as to contact same, or instead other layer(s) may be located between layer 2 and substrate 1. In any event, layer 2 may be referred to herein as an "index matching" layer. This phrase "index matching" (or "index coupling") means that layer 2 has an index of refraction "n" having a value that is between the respective indices of refraction "n" values of substrate 1 and DLC inclusive layer 3, in order to reduce visible light reflections off of the resulting coated article.

Anti-reflective layer 2 is preferably deposited on substrate 1 utilizing at least a siloxane gas, such as hexamethyldisiloxane (HMDSO) gas, via an ion beam deposition process. It is noted that oxygen (O), argon (Ar) and/or other gas(es) may also be used in combination with the siloxane (e.g., HMDSO) in forming layer 2. When HMDSO [see FIG. 9] is used during the deposition process for layer 2, either alone or in combination with other gas(es), the resulting layer 2 includes DLC and may be referred to as a DLC inclusive layer that is a hybrid amorphous mixture of DLC and $SiO_x$ that includes $sp^3$ carbon-carbon (C—C) bonds, silicon-oxygen (Si—O) bonds, etc. In certain other embodiments of this invention, this type of anti-reflective layer 2 may instead be formed where the HMDSO [see FIG. 9] is replaced in the ion beam deposition process with another siloxane gas or oxygen inclusive organosilicon compound gas such as but not limited to tetramethyldisiloxane (TMDSO) [see FIG. 14], octamethylcyclotetrasiloxane (OMCTSO) [see FIG. 13], tetraethoxylsilane (TEOS) [see FIG. 15], any other suitable siloxane, any other suitable ethoxy substituted silane, any other alkoxy substituted silane, any other oxygen inclusive organosilicon compound inclusive gas, or any combination or mixture thereof, etc. Again, these other gas(es) may be used either alone or in combination with other gas(es) such as oxygen (O) and/or argon (Ar) to form layer 2 via an ion beam deposition or any other suitable process. Other than the O and Ar gases mentioned above, each of these gases is considered one or both of a siloxane gas or an oxygen inclusive organosilicon compound gas, as will be appreciated by those skilled in the art.

By using the aforesaid gas(es) during the formation of anti-reflective index coupling layer 2, the resulting layer 2 even when including DLC is not as hard as DLC inclusive layer 3 because layer 2 preferably has a lesser amount/percentage of $sp^3$ carbon-carbon (C—C) bonds than does layer 3. Moreover, the aforesaid gases enable a DLC inclusive layer 2 to be formed that has an index of refraction "n" that is from about 1.4 to 2.0, more preferably from about 1.5 to 1.8, thereby enabling layer 2 to function in an index coupling manner so as to reduce visible reflections. It is also noted that layer 2 also functions as a primer layer to improve bonding between a glass substrate 1 and DLC inclusive layer 3. Because there is more Si in layer 2 than in layer 3, layer 2 tends to bond better to substrate 1 than would layer 3 and layer 3 tends to bond better to layer 2 than it would to the substrate 1 (see discussion of TMS layer in parent application(s), incorporated herein by reference). In still further embodiments of this invention, TMS gas (see FIG. 11), 3MS gas (see FIG. 12), DMS gas (see FIG. 10), and/or any other suitable gas may be used instead of or in combination with HMDSO in the ion beam deposition of layer 2 on substrate 1.

DLC inclusive layer 3 preferably includes at least some amount of DLC in the form of highly tetrahedral amorphous carbon (ta-C) (i.e., including $sp^3$ carbon-carbon (C—C) bonds), in order to enhance the durability and/or scratch resistance of the coated article. In certain embodiments, one or both of layers 2 and 4 may also include at least some amount of highly tetrahedral amorphous carbon (ta-C), although typically not as much as is present in layer 3 so that layer 3 is harder than layers 2 and 4. Thus, DLC inclusive layer 3 preferably has a greater percentage per unit area of highly tetrahedral amorphous carbon (ta-C) than do either of layers 2 and 4. Highly tetrahedral amorphous carbon (ta-C) forms sp carbon-carbon (C—C) bonds, and is a special form of diamond-like carbon (DLC).

DLC inclusive layer 3 may be formed and deposited on substrate 1 in any manner described for depositing a DLC inclusive layer described in any of the parent applications Ser. Nos. 09/617,815, 09/303,548, 09/442,805, or 09/583,862, all of which are incorporated herein by reference. Preferably DLC inclusive layer 3 is deposited on substrate 1 and layer 2 via an ion beam deposition process using at least a hydrocarbon gas such as $C_2H_2$ (acetylene). Other gas(es) such as oxygen and/or argon may be used in combination with acetylene during this deposition process. In other embodiments of this invention, acetylene gas may be replaced or complimented with e.g., any other suitable hydrocarbon gas for use in or adjacent the ion beam source during the deposition of DLC inclusive layer 3. The use of, for example, acetylene gas results in a DLC inclusive layer 3 that has more $sp^3$ carbon-carbon (C—C) bonds than do either of layers 2 and 4. Thus, layer 3 is harder than layers 2 and 4 and functions to improve the durability (e.g., scratch resistance and/or chemical resistance) of the resulting coated article.

In embodiments where primer layer 4 is desired, layer 4 is deposited on (either directly or indirectly) DLC inclusive layer 3. Oxide inclusive primer layer 4 preferably is deposited on layer 3 utilizing at least a siloxane gas such as hexamethyldisiloxane (HMDSO) gas via an ion beam deposition process. It is noted that oxygen (O), argon (Ar) and/or other gas(es) may also be used in combination with the HMDSO [see FIG. 9] in forming layer 4. When HMDSO is used during the deposition process for primer layer 4, either alone or in combination with other gas(es), the resulting primer layer 4 includes DLC, and may be referred to as a DLC inclusive layer that is a hybrid amorphous mixture of DLC and $SiO_x$ that includes sp carbon-carbon (C—C) bonds, silicon-oxygen (Si—O) bonds, etc. In certain other embodiments of this invention, this type of primer layer 4 may instead be formed where the HMDSO is replaced in the deposition process with another siloxane gas or an oxygen inclusive organosilicon compound gas such as but not limited to tetramethyldisiloxane (TMDSO) [see FIG. 14], octamethylcyclotetrasiloxane (OMCTSO) [see FIG. 13], tetraethoxylsilane (TEOS) [see FIG. 15], any other suitable siloxane, any other suitable ethoxy substituted silane, any other alkoxy substituted silane, any other oxygen inclusive organosilicon compound inclusive gas, any combination or mixture thereof, etc. Again, these other gas(es) may be used either alone or in combination with other gas(es) such as oxygen and/or argon to form primer layer 4 via an ion beam deposition process. Each of these gases (other than O and Ar) is considered one or both of a siloxane gas or an oxygen inclusive organosilicon compound gas, as will be appreciated by those skilled in the art.

By using these gases during the formation of primer layer 4, the resulting layer 4 even when including DLC is not as hard as DLC inclusive layer 3 because layer 4 preferably has a lesser amount/percentage of $sp^3$ carbon-carbon (C—C) bonds than does layer 3. Purposes of primer layer 4 include improving bonding between FAS inclusive layer 6 and DLC inclusive layer 3, and improving durability of the overall coating system. As for improving the bonding characteristics of FAS inclusive layer 6 to DLC inclusive layer 3, it is believed that FAS will not bond extremely well to carbon itself in layer 3, but will bond to materials such as silicon oxide which is in primer layer 4. Thus, the Si, C, and/or O in primer layer 4 enables layer 4 to be both durable (due to the DLC in layer 4) as well as improve bonding between layers 6 and 3 (due to the C, Si and/or O in layer 4). For example, DLC inclusive layer 3 bonds well to the C and/or Si in primer layer 4, while the FAS inclusive layer 6 bonds well to the Si and/or O in primer layer 4.

In other embodiments of this invention, primer layer 4 need not include DLC and instead may be made of or include any of titanium oxide ($TiO_x$), silicon oxide ($SiO_x$), $VO_x$, $HfO_x$, any mixture thereof, or any other suitable material such as another oxide layer. In still further embodiments of this invention, any of the aforesaid oxides may be mixed with a DLC inclusive material (e.g., deposited via HMDSO or any of the other gases discussed above) to form primer layer 4.

When a hydrophobic coating is desired, this may be achieved in any manner described in any of the parent application(s), all incorporated herein by reference. Layer 6 may or may not be needed in hydrophobic embodiments depending upon the manner in which hydrophobicity is achieved. Where fluoro-alkyl silane (FAS) compound inclusive layer 6 is desired, it may be applied on substrate 1 over layers 2, 3 and 4 as shown in FIGS. 1(a) and 1(b). Due at least to hydrophobic layer 6, the resulting coating system 5 can function in a hydrophobic manner (i.e., it is characterized by high water contact angles θ and/or low surface energies as described below), and optionally may be characterized by low tilt angle(s) β in certain embodiments. In general, the DLC inclusive layer(s) 2, 3 and/or 4 provide durability, hydrophobicity and priming, while FAS inclusive layer 6 functions to even further increase the contact angle θ of the coating system 5.

It is surmised that the surface of DLC inclusive primer layer 4 (or layer 3 when primer layer 4 is not present in certain embodiments) includes highly reactive dangling bonds immediately after its formation/deposition, and that the application of FAS inclusive layer 6 onto the surface of primer layer 4 shortly after layer 4's formation enables tight binding and/or anchoring of FAS inclusive layer 6 to the surface of layer 4. This results in increased contact angle θ (improved hydrophobicity) and a durable coating system 5. In certain embodiments of this invention, it has been found that FAS inclusive layer 6 bonds more completely to DLC inclusive primer layer 4 when FAS layer 6 is applied on the upper surface of layer 4 within one hour or so after layer 4 is formed, more preferably within thirty minutes after layer 4 is formed, and most preferably within twenty minutes after layer 4 is formed. As discussed in more detail below (see FIG. 8), at least FAS inclusive layer 6 may be heated (thermally cured) after it has been deposited on the substrate 1 in order to improve its durability in certain embodiments.

Overlying layer 6 may be substantially all FAS, or only partially FAS in different embodiments of this invention. Layer 6 preferably includes at least one compound having an FAS group. Generally speaking, FAS compounds generally comprise silicon atoms bonded to four chemical groups. One or more of these groups contains fluorine and carbon atoms, and the remaining group(s) attached to the silicon atoms are typically alkyl (hydrocarbon), alkoxy (hydrocarbon attached to oxygen), or halide (e.g., chlorine) group(s). Exemplary types of FAS for use in layer 6 include $CF_3(CH_2)_2Si(OCH_3)_3$ [i.e., 3,3,3 trifluoropropyl)trimethoxysilane]; $CF_3(CF_2)_5(CH_2)_2Si(OCH_2CH_3)_3$ [i.e., tridecafluoro-1,1,2,2-tetrahydrooctyl-1-triethoxysilane]; $CF_3(CH_2)_2SiCl_3$; $CF_3(CF_2)_5(CH_2)_2SiCl_3$; $CF_3(CF_2)_7(CH_2)_2Si(OCH_3)_3$; $CF_3(CF_2)_5(CH_2)_2Si(OCH_3)_3$; $CF_3(CF_2)_7(CH_2)_2SiCl_3$; $CF_3(CF_2)_7(CH_2)_2SiCH_3Cl_2$; and/or $CF_3(CF_2)_7(CH_2)_2SiCH_3(OCH_3)_2$. These FAS material may be used either alone or in any suitable combination for layer 6. At least partial hydrolysate (hydrolysed) versions of any of these compounds may also be used. Moreover, it is noted that this list of exemplary FAS materials is not intended to be limiting, as other FAS type materials may also be used in layer 6. While FAS inclusive layer 6 is applied over layers 2–4 physical rubbing (or buffing) in certain preferred embodiments of this invention, layer 6 could instead be applied in any other suitable manner in other embodiments of this invention. Moreover, according to alternative embodiments of this invention, a hydrophobic type layer 6 for increasing contact angle and thus hydrophobicity need not include FAS. Other hydrophobic layers 6 could instead be used.

According to certain embodiments of this invention, while layers 2-4 may each include DLC, at least two of these three layers is/are preferably deposited using different precursor or feedstock gases (e.g., a siloxane gas such as HMDSO or the like for layer(s) 2, 4 vs. a hydrocarbon gas such as $C_2H_2$ or the like for layer 3) so that layer 3 has different characteristics (e.g., different hardnesses and/or densities) than layer(s) 2 and/or 4. Layers 2 and 4 may have approximately the same characteristics in certain embodiments of this invention. Alternatively, layers 2 and 4 may also have different characteristics and be deposited with different gases or gas combinations in other embodiments of this invention.

In an exemplary embodiment, anti-reflective index matching DLC inclusive layer 2 may be deposited using a plasma ion beam deposition technique utilizing HMDSO gas and oxygen (O) gas (e.g., the oxygen gas may flow through the ion beam source itself while the HMDSO gas may be introduced into the ion beam outside of the source itself between the slit and the substrate and/or in the source itself). Meanwhile, DLC inclusive layer 3 may be deposited using an ion beam deposition technique utilizing a $C_2H_2$ (acetylene) inclusive precursor or feedstock gas either alone or in combination with oxygen and/or argon. Still further, primer DLC inclusive layer 4 may be deposited using an ion beam deposition technique utilizing HMDSO gas and both argon (Ar) and oxygen (O) gas (e.g., the oxygen/argon gases may flow through the ion beam source itself while the HMDSO gas may be introduced into the ion beam outside of the source itself between the slit and the substrate and/or in the source itself). The addition of the Ar gas for use in depositing primer layer 4 (Ar may not be used for layer 2) may cause layer 4 to have a greater hardness than layer 2, although layer 4 may still not be as hard as layer 3.

Additionally, it is believed that the underlying layer 2 (including DLC, Si and O) deposited using e.g., HMDSO functions as a barrier layer to prevent certain impurities from getting into or out of the substrate 1. Moreover, when HMDSO (see FIG. 9) is used in the deposition process of layer 2, the Si in layer 2 helps to enable overlying DLC inclusive layer 3 to better bond and/or adhere to a glass substrate 1 via layer 2.

Surprisingly, it has also been found that the use of layer 2 (e.g., deposited via HMDSO or other siloxane gas) provides a more continuous/contiguous coating on a glass surface at very thin thicknesses as compared to a DLC inclusive layer 3 deposited using $C_2H_2$ (acetylene) gas directly on glass. As a result, layer 2 can be deposited first directly on glass I at a relatively thin thickness, and the overlying layer 3 need not be as thick as would otherwise be required. In general, the thinner the layer 3, the higher the transmission of the overall coating system. Moreover, the provision of layer 2 may enable improved yields to be achieved, as the occurrence of pinholes in the coating system is less likely.

In embodiments such as where DLC inclusive layer 3 is formed on the substrate using a $C_2H_2$ (acetylene) inclusive precursor or feedstock gas and DLC inclusive layers 2 and/or 4 is/are formed on the substrate using at least a HMDSO (or other siloxane or oxygen inclusive organosilicon gas) inclusive precursor or feedstock gas, then layer(s) 2 and/or 4 tend to intermix with layer 3 during the deposition process. Thus, there may not be a clear line(s) delineating or separating layers 2, 3 and 4 in the final product due to this intermixing (i.e., ion mixing) of the material from the different layers. However, for purposes of simplicity, the layers 2-4 are referred to and illustrated herein as separate layers due to the different deposition processes (e.g., gases and/or energies) used in respective formations of adjacent layers.

It has been found that the DLC inclusive layer 3 formed using a hydrocarbon gas, such as $C_2H_2$ (acetylene) inclusive precursor or feedstock, tends to have a greater hardness and density than do layers 2 and 4 formed e.g., using at least a siloxane such as HMDSO inclusive precursor or feedstock gas. For example, in certain exemplary embodiments of this invention, layer 3 may have an average hardness (measured via a nano-indentation hardness measuring technique) of from about 45-85 GPa, more preferably from about 50-70 GPa, and most preferably from about 55-60 GPa. Meanwhile, when formed via HMDSO or some other siloxane, layer(s) 2 and 4 may have an average hardness(es) of from about 1-35 GPa, and more preferably from about 10-30 GPa. Using a nano-indentation hardness measuring technique, the final coating system 5, including e.g., layers 2-4 and 6, may have an average hardness of at least about 10 GPa, more preferably from about 25-60 GPa, and even more preferably from about 30-45 GPa.

Thus, coating system 5 includes silicon (Si) and oxygen (O) and DLC inclusive layer 2 which functions as both an index matching/coupling layer and to improve the bonding characteristics of harder DLC inclusive layer 3 to the substrate. While the Si in layer 2 improves the bonding of layer 3 to substrate 1, it is preferred that less Si be provided in layer 3 than in layer 2 because the provision of Si in a DLC inclusive layer may result in decreased scratch resistance and/or decreased hardness. Layer 3 may or may not include Si in different embodiments of this invention. While layer 2 allows for improved bonding to the substrate and reduced visible light reflections, the provision of DLC and some $sp^3$ carbon-carbon bonds therein allows this layer 2 to have rather high hardness values so as to render the resulting product more durable and thus resistant to scratching, abrasions, and the like. Because primer layer 4 may include DLC, Si and O in certain embodiments as well, many of these same attributes apply to layer 4 as well.

In embodiments where substrate 1 is of or includes glass (e.g., soda-lime-silica glass), anti-reflective layer 2 may be from about 10 to 250 angstroms (A) thick, more preferably from about 10 to 150 angstroms thick, and most preferably from about 30-50 angstroms thick; DLC inclusive layer 3 may be from about 10 to 250 angstroms thick, more preferably from about 10 to 150 angstroms thick, and most preferably about 30-60 angstroms (Å) thick, and primer layer 4 may be from about 10 to 250 Å thick, more preferably from about 10 to 150 Å thick. FAS inclusive layer 6 may be from about 5-80 angstroms (Å) thick, more preferably from about 20-50 Å thick. However, these thicknesses are not limiting and the layers may be of other appropriate thicknesses in certain embodiments of this invention. Moreover, in embodiments where substrate 1 is of or includes plastic, layers 2, 3 and/or 6 may be of greater thickness(es) than those described above.

In certain embodiments, DLC inclusive layer 3 may have an approximately uniform distribution of $sp^3$ carbon-carbon bonds throughout a large portion of its thickness, so that much of the layer has approximately the same density. In such embodiments, layers 2 and/or 4 may include a lesser percentage(s) of sp$^3$ carbon-carbon bonds. As with layer 3, the distribution of sp$^3$ carbon-carbon bonds in layers 2 and 4 may be approximately uniform through their respective thicknesses, or alternatively may vary. In layer 2 for example, the percentage or ratio of sp$^3$ carbon-carbon bonds may increase throughout the thickness of the layer 2 toward layer 3. Likewise, in layer 3 the percentage or ratio of sp$^3$ carbon-carbon bonds may be approximately uniform through the layer's thickness or instead may gradually increase throughout the thickness of the layer 3 toward layer 4. It is noted that in DLC inclusive layer 3, at least about 40% (more preferably at least about 60%, and most preferably at least about 80%) of the carbon-carbon bonds in that layer 3 are of the sp$^3$ carbon-carbon type. In each of layers 2 and 4, at least about 5% (more preferably at least about 10%, and most preferably at least about 20%) of the carbon-carbon bonds are of the sp$^3$ carbon-carbon type. However, in layers 2 and 4 a lesser percentage of the total bonds in the entire layer(s) are sp$^3$ carbon-carbon type bonds due to the presence of, e.g., Si and O in these layers.

It is believed that the presence of sp$^3$ carbon-carbon bonds in layers 2-4 increases the density and hardness of the coating system, thereby enabling it to satisfactorily function in automotive environments. Layers 2-4 may or may not include sp$^2$ carbon-carbon bonds in different embodiments, although formation of sp$^2$ carbon-carbon bonds is likely in all of these layers and even preferred to some extent especially in layers 2 and 4.

When hydrophobicity is desired, in order to improve the hydrophobic nature of coating system 5 atoms in addition to carbon (C) may be provided in at least layer 3 when layers 4 and 6 are not provided. For example, in certain embodiments of this invention when layer 3 is the outermost layer, that layer 3 (taking the entire layer thickness, or only a thin 10 Å thick layer portion thereof into consideration) may include in addition to the carbon atoms of the sp$^3$ carbon-carbon bonds, by atomic percentage, from about 0-20% Si (more preferably from about 0-10%), from about 0-20% oxygen (O) (more preferably from about 0-15%), and from about 5-60% hydrogen (H) (more preferably from about 535% H). Optionally, in such embodiments layer 3 may include from about 0-10% (atomic percentage) fluorine (F) (more preferably from about 0-5% F) in order to further enhance hydrophobic characteristics of the coating. This is discussed in more detail in one or more of the parent cases, incorporated herein by reference. In general, the provision of H in layer 3 reduces the number of polar bonds at the coating's surface, thereby improving the coating system's hydrophobic properties. These material(s) may or may not be provided in layer 3 when a hydrophobic coating system is not desired, or when layers 4 and 6 are provided in the system.

FIG. 1(c) is a side cross sectional view of a coated article according to another embodiment of this invention, the coated article including substrate 1 and layers 2 and 3 thereon. This FIG. 1(c) embodiment is similar to the FIGS. 1(a)-1(b) embodiment, except that layers 4 and 6 are not provided in this embodiment. Thus, for example, the coated article may include substrate 1 (e.g., glass) on which layer 2 (e.g., formed using a HMDSO, or other siloxane or oxygen inclusive organosilicon gas) and DLC inclusive layer 3 (e.g., formed using C$_2$H$_2$ gas) are formed. This coated article may or may not be hydrophobic in different embodiments of this invention. Optionally, this coated article may even be hydrophillic in certain embodiments of this invention.

FIG. 2 is a side cross sectional view of a coated article according to another embodiment of this invention, including substrate 1 (e.g. glass), DLC inclusive coating system 5 including layers 2, 3, 4 and 6 as described above with regard to the FIG. 1 embodiment, and intermediate layer(s) 7 provided between layer 2 and substrate 1. Intermediate layer 7 may be of or include, for example, any of silicon nitride, silicon oxide, an infrared (IR) reflecting layer or layer system, an ultraviolet (UV) reflecting layer or layer system, another DLC inclusive layer(s), or any other type of desired layer(s). In this embodiment, it is noted that coating system 5 is still "on" substrate 1. The term "on" herein means that substrate 1 supports DLC coating system 5, regardless of whether or not other layer(s) (e.g. 7) are provided therebetween (this also applies to the term "over" herein). Thus, coating system 5 may be provided directly on substrate 1 as shown in FIG. 1, or may be provided on substrate I with another coating system or layer 7 therebetween as shown in FIG. 2. Exemplar coatings/layers that may be used as low-E or other coating(s)/layer(s) 7 are shown and/or described in any of U.S. Pat. Nos. 5,837,108, 5,800,933, 5,770,321, 5,557,462, 5,514,476, 5,425,861, 5,344,718, 5,376,455, 5,298,048, 5,242,560, 5,229,194, 5,188,887 and 4,960,645, which are all hereby incorporated herein by reference.

FIG. 3 illustrates another embodiment of this invention that is the same as the FIG. 1 embodiment, except that primer layer 4 is not provided. It has been found that primer layer 4 need not be provided in all embodiments of this invention. Likewise, in other embodiments of this invention (not shown), FAS inclusive layer 6 need not be provided. In still further embodiments (not shown), one or more intermediate layer(s) 7 may be provided between layer 2 and substrate 1 in the FIG. 3 embodiment.

Referring to the different embodiments of FIGS. 1–3, coating system 5 is at least about 60% transparent to or transmissive of visible light rays, more preferably at least about 70% transmissive, even more preferably at least about 85% transmissive, and most preferably at least about 95% transmissive of visible light rays.

When substrate 1 is of glass, it may be from about 1.0 to 5.0 mm thick, preferably from about 2.3 to 4.8 mm thick, and most preferably from about 3.7 to 4.8 mm thick. In certain embodiments, another advantage of coating system 5 is that the ta-C (e.g., in layers 2–4) therein may reduce the amount of soda (e.g., from a soda-lime-silica glass substrate 1) that can reach the surface of the coated article and cause stains/corrosion. In such embodiments, substrate 1 may be soda-lime-silica glass and include, on a weight basis, from about 60–80% SiO$_2$, from about 10–20% Na$_2$O, from about 0–16% CaO, from about 0–10% K$_2$O, from about 0–10% MgO, and from about 0–5% Al$_2$O$_3$. Iron and/or other additives may also be provided in the glass composition of the substrate 1. In certain other embodiments, substrate 1 may be soda lime silica glass including, on a weight basis, from about 66–75% SiO$_2$, from about 10–20% Na$_2$O, from about 5–15% CaO, from about 0–5% MgO, from about 0–5% Al$_2$O$_3$, and from about 0–5% K$_2$O. Most preferably, substrate 1 is soda lime silica glass including, by weight, from about 70–74% SiO$_2$, from about 12–16% Na$_2$O, from about 7–12% CaO, from about 3.5 to 4.5% MgO, from about 0 to 2.0% Al$_2$O$_3$, from about 0–5% K$_2$O, and from about 0.08 to 0.15% iron oxide. Soda lime silica glass according to any of the above embodiments may have a density of from about 150 to 160 pounds per cubic foot (preferably about 156), an average short term bending strength of from about 6,500 to 7,500 psi (preferably about 7,000 psi), a specific heat (0–100 degrees C.) of about 0.20 Btu/lbF, a softening point of from about 1330 to 1345 degrees F., a thermal conductivity of from about 0.52 to 0.57 Btu/hrftF, and a coefficient of linear expansion (room temperature to 350 degrees C.) of from about 4.7 to 5.0×10$^{-6}$ degrees F. Also, soda lime silica float glass available from Guardian Industries Corp., Auburn Hills, Mich., may be used as substrate 1. Any such aforesaid glass substrate 1 may be, for example, green, blue or grey in color when appropriate colorant(s) are provided in the glass in certain embodiments.

In certain other embodiments of this invention, substrate 1 may be of borosilicate glass, or of substantially transparent plastic, or alternatively of ceramic. In certain borosilicate embodiments, the substrate 1 may include from about 75–85% $SiO_2$, from about 0–5% $Na_2O$, from about 0 to 4% $Al_2O_3$, from about 0–5% $K_2O$, from about 8–15% $B_2O_3$, and from about 0–5% $Li_2O$.

In still further embodiments, an automotive window (e.g. windshield or side window) including any of the above glass substrates laminated to a plastic substrate may combine to make up substrate 1, with the coating system(s) of any of the FIGS. 1–3 embodiments or any other embodiment herein provided on the outside or inside surface(s) of such a window. In other embodiments, substrate 1 may include first and second glass sheets of any of the above mentioned glass materials laminated to one another, for use in window (e.g. automotive windshield, residential window, commercial architectural window, automotive side window, vacuum IG window, automotive backlight or back window, etc.) and other similar environments.

In hydrophobic embodiments of this invention, hydrophobic performance of the coating system of any of the FIGS. 1–3 embodiments is a function of contact angle $\theta$, surface energy $\gamma$, tilt angle $\beta$, and/or wettability or adhesion energy W.

The surface energy $\gamma$ of a coating system may be calculated by measuring its contact angle $\theta$ (contact angle $\theta$ is illustrated in FIGS. 4(a) and 4(b)). FIG. 4(a) shows the contact angle of a drop on a substrate absent this invention, while FIG. 4(b) shows the contact angle of a drop on a substrate having a coating system thereon according to a hydrophobic embodiment of this invention. A sessile drop 31 of a liquid such as water is placed on the coating as shown in FIG. 4(b). A contact angle $\theta$ between the drop 31 and underlying coating system 5 appears, defining an angle depending upon the interface tension between the three phases in the point of contact. Generally, the surface energy $\gamma_c$ of a coating system can be determined by the addition of a polar and a dispersive component, as follows: $\gamma_c = \gamma_{CP} + \gamma_{CD}$, where $\gamma_{CP}$ is the coating's polar component and $\gamma_{CD}$ the coating's dispersive component. The polar component of the surface energy represents the interactions of the surface which is mainly based on dipoles, while the dispersive component represents, for example, van der Waals forces, based upon electronic interactions. Generally speaking, the lower the surface energy $\gamma_C$ of coating system 5, the more hydrophobic the coating and the higher the contact angle $\theta$.

Adhesion energy (or wettability) W can be understood as an interaction between polar with polar, and dispersive with dispersive forces, between the coating system and a liquid thereon such as water. $\gamma^P$ is the product of the polar aspects of liquid tension and coating/substrate tension; while $\gamma^D$ is the product of the dispersive forces of liquid tension and coating/substrate tension. In other words, $\gamma^P = \gamma_{LP} * \gamma_{CPA}$; and $\gamma^D = \gamma_{LD} * \gamma_{CD}$; where $\gamma_{LP}$ is the polar aspect of the liquid (e.g. water), $\gamma_{CP}$ is the polar aspect of coating system (e.g., coating system 5); $\gamma_{LD}$ is the dispersive aspect of liquid (e.g. water), and $\gamma_{CD}$ is the dispersive aspect of the coating system. It is noted that adhesion energy (or effective interactive energy) W, using the extended Fowkes equation, may be determined by:

$W = [\gamma_{LP} * \gamma_{CP}]^{1/2} + [\gamma_{LD} * \gamma_{CD}]^{1/2} = \gamma_1(1 + \cos \theta)$, where $\gamma_1$ is liquid tension and $\theta$ is the contact angle. W of two materials is a measure of wettability indicative of how hydrophobic the coating system is.

When analyzing the degree of hydrophobicity of outermost layer/portion of the coating system 5 with regard to water, it is noted that for water $\gamma_{LP}$ is 51 mN/m and $\gamma_{LD}$ is 22 mN/m. In certain embodiments of this inention, the polar aspect $\gamma_{CP}$ of surface energy of layers 3, 4 and/or 6 is from about 0 to 0.2 (more preferably variable or tunable between 0 and 0.1) and the dispersive aspect $\gamma_{CD}$ of the surface energy of layers 3, 4 and/or 6 is from about 16–22 mN/m (more preferably from about 16–20 mN/m). Using the above-listed numbers, according to certain embodiments of this invention, the surface energy $\gamma_C$ of layer 6 (or 3 in certain embodiments) (and thus coating system 5) is less than or equal to about 20.2 mN/m, more preferably less than or equal to about 19.5 mN/m, and most preferably less than or equal to about 18.0 mN/m; and the adhesion energy W between water and the coating system is less than about 25 mN/m, more preferably less than about 23 mN/m, even more preferably less than about 20 mN/m, and most preferably less than about 19 mN/m. These low values of adhesion energy W and the coating system's surface energy yc, and the high initial contact angles $\theta$ achievable, illustrate the improved hydrophobic nature of the coating systems 5 according to different embodiments of this invention. While layers 3, 4 and/or 6 functions to provide much of the hydrophobic nature of the coating system 5, optional underlying DLC inclusive layer 2 improves the bonding characteristics of the coating system 5 to the substrate 1 (e.g., glass substrate) and yet still provides adequate hardness characteristics regarding the coating system 5 as a whole.

The initial contact angle $\theta$ of a conventional glass substrate 1 with sessile water drop 31 thereon is typically from about 22–24 degrees, although it may dip as low as 17 or so degrees in some circumstances, as illustrated in FIG. 4(a). Thus, conventional glass substrates are not particularly hydrophobic in nature. In hydrophobic embodiments of this invention, the provision of coating system 5 on substrate 1 causes the contact angle $\theta$ to increase to the angles discussed herein, as shown in FIG. 4(b) for example, thereby improving the hydrophobic nature of the article. As discussed in Table 1 of Ser. No. 09/303,548, the contact angle $\theta$ of a ta-C DLC layer is typically less than 50 degrees, although it may be higher than that in certain circumstances as a function of ion energy. However, the makeup of DLC-inclusive coating system 5 described herein (with or without FAS inclusive layer 6) enables the initial contact angle $\theta$ of the system relative to a water drop (i.e. sessile drop 31 of water) to be increased in certain embodiments to at least about 80 degrees, more preferably to at least about 100 degrees, even more preferably at least about 110 degrees, and most preferably at least about 125 degrees, thereby improving the hydrophobic characteristics of the DLC-inclusive coating system. An "initial" contact angle $\theta$ means prior to exposure to environmental conditions such as sun, rain, abrasions, humidity, etc.

FIGS. 5–6 illustrate an exemplary linear or direct ion beam source 25 which may be used to deposit layers 2, 3 and 4 of coating system 5, clean a substrate, or surface plasma treat a DLC inclusive coating with H and/or F according to different embodiments of this invention. Ion beam source 25 includes gas/power inlet 26, anode 27, grounded cathode magnet portion 28, magnet poles 29, and insulators 30. A 3 kV DC power supply may be used for source 25 in some embodiments. Linear source ion deposition allows for substantially uniform deposition of layers 24 as to thickness and stoichiometry. As mentioned above, FAS inclusive layer 6 is preferably not applied using ion beam technology (rubbing/buffing is a preferred deposition technique for layer 6), although it may be formed in such a manner in certain embodiments of this invention.

Ion beam source 25 is based upon a known gridless ion source design. The linear source is composed of a linear shell (which is the cathode and grounded) inside of which lies a concentric anode (which is at a positive potential). This geometry of cathode-anode and magnetic field 33 gives rise to a close drift condition. The anode layer ion source can also work in a reactive mode (e.g. with oxygen and nitrogen). The source includes a metal housing with a slit in a shape of a race track as shown in FIGS. 5–6. The hollow housing is at ground potential. The anode electrode is situated within the cathode body (though electrically insulated) and is positioned just below the slit. The anode can be connected to a positive potential as high was 3,000 or more volts (V). Both electrodes may be water cooled in certain embodiments. Feedstock/precursor gases, described herein, are fed through the cavity between the anode and cathode. The gas(es) used determines the make-up of the resulting layer deposited on an adjacent substrate 1.

The linear ion source also contains a labyrinth system that distributes the precursor gas (e.g., TMS (i.e., $(CH_3)_4Si$ or tetramethylsilane); acetylene (i.e., $C_2H_2$); 3MS (i.e., trimethyldisilane); DMS (i.e., dichloro-dimethylsilane); HMDSO (i.e., hexamethyldisiloxane); TEOS (i.e., tetraethoxysilane), etc.) fairly evenly along its length and which allows it to supersonically expand between the anode-cathode space internally. The electrical energy then cracks the gas to produce a plasma within the source. The ions are expelled out at energies in the order of eVc-a/2 when the voltage is Vc-a. The ion beam emanating from the slit is approximately uniform in the longitudinal direction and has a Gaussian profile in the transverse direction. Exemplary ions 34 are shown in FIG. 6. A source as long as one meter may be made, although sources of different lengths are anticipated in different embodiments of this invention. Finally, electron layer 35 is shown in FIG. 6 completes the circuit thereby enabling the ion beam source to function properly.

In certain embodiments of this invention, gases discussed herein (e.g., HMDSO, TEOS, acetylene, etc.) may be fed through the ion beam source via cavity 42 until they reach the area near slit 44 where they are ionized. However, in other embodiments of this invention described above, a gas such as HMDSO (e.g., for layers 2 and 4) may be injected into the ion beam at location 39 between the slit and the substrate 1, while gas such as oxygen and/or argon is caused to flow through cavity 42 in the source itself adjacent the ion emitting slit 44. Alternatively, gases such as HMDSO, TEOS, etc. may be injected into the ion beam both at 39 and via cavity 42.

In alternative embodiments of this invention, an ion beam source device or apparatus as described and shown in FIGS. 1–3 of U.S. Pat. No. 6,002,208 (hereby incorporated herein by reference in its entirety) may be used to deposit/form DLC inclusive layers 2–4 on substrate 1 in accordance with any of the FIGS. 1–3 embodiments of this invention. One or multiple such ion beam source devices may be used (e.g., one source may deposit all layers 2–4, or alternatively a different source may be used for each of layers 2–4). In certain embodiments, another ion beam source may be provided for initially cleaning the surface of substrate 1 prior to deposition of layers 2–4. After layers 2–4 are deposited, FAS inclusive layer 6 is preferably applied or deposited thereon.

Referring to FIG. 7, tilt angle β characteristics associated with certain embodiments of this invention will be explained. In a hydrophobic coating, it is often desirable in certain embodiments to have a high contact angle θ (see FIG. 4(b)) in combination with a low tilt angle β. As shown in FIG. 7, tilt angle β is the angle relative to the horizontal 43 that the coated article must be tilted before a 30 μL (volume) drop 41 (e.g., of water) thereon begins to flow down the slant at room temperature without significant trail. A low tilt angle means that water and/or other liquids may be easily removed from the coated article upon tilting the same or even in high wind conditions. In certain embodiments of this invention, coated articles herein have an initial tilt angle β of no greater than about 30 degrees, more preferably no greater than about 20 degrees, and even more preferably no greater than about 10 degrees. In certain embodiments, the tilt angle does not significantly increase over time upon exposure to the environment and the like, while in other embodiments it may increase to some degree over time.

Referring to FIGS. 1 and 5–6, an exemplary method of depositing a coating system 5 on substrate 1 will now be described. This method is for purposes of example only, and is not intended to be limiting.

Prior to coating system 5 being formed on glass substrate 1, the top surface of substrate 1 may be cleaned by way of a first linear or direct ion beam source. For example, a glow discharge in argon (Ar) gas or mixtures of $Ar/O_2$ (alternatively $CF_4$ plasma) may be used to remove any impurities on the substrate surface. Such interactions are physio-chemical in nature. This cleaning creates free radicals on the substrate surface that subsequently can be reacted with other monomers yielding substrate surfaces with specialized properties. The power used may be from about 100–300 Watts. Substrate 1 may also be cleaned by, for example, sputter cleaning the substrate prior to actual deposition of coating system 5; using oxygen and/or carbon atoms at an ion energy of from about 800 to 1200 eV, most preferably about 1,000 eV.

After cleaning, the deposition process begins using a linear ion beam deposition technique via second ion beam source as shown in FIGS. 5–6, or in FIGS. 1–3 of the '208 patent; with a conveyor having moved the cleaned substrate 1 from the first or cleaning source to a position under the second source. The second ion beam source functions to deposit a DLC inclusive index matching layer 2 on substrate 1, with at least HMDSO and oxygen being used as gas(es) fed through the source or inserted at 39. Because of the Si in the HMDSO gas used in the source, the resulting layer 2 formed on substrate includes at least Si and O as well as DLC. The Si portion of DLC inclusive layer 2 enables good bonding of layer 2 to substrate 1 (substrate 1 is glass in this example), and thus will also improve the bonding characteristics of layer 3 to the substrate via layer 2. The O portion of layer 2 increases transmission and enables the refractive index "n" of layer 2 to be lowered so as to reduce visible light reflections off of the final coated article.

After layer 2 has been formed, either the same or another ion beam source is used to deposit layer 3 over (directly on in preferred embodiments) layer 2. To deposit overlying DLC inclusive layer 3, another gas such as at least $C_2H_2$ is fed through the source (or inserted at location 39) so that the source expels the ions necessary to form layer 3 overlying layer 2 on substrate 1. The $C_2H_2$ gas may be used alone, or in exemplary alternative embodiments the gas may be produced by bubbling a carrier gas (e.g. $C_2H_2$) through a precursor monomer (e.g. TMS or 3MS) held at about 70 degrees C. (well below the flashing point). Acetylene feedstock gas ($C_2H_2$) is used in certain embodiments for depositing layer 3 to prevent or minimize/reduce polymerization (layer 2 may or may not be polymerized in certain embodiments) and to obtain an appropriate energy to allow the ions to penetrate the surface on the substrate/layer 2 and subimplant therein, thereby causing layer 3 to intermix with layer 2 in at least an interface portion between the layers. The actual gas flow may be controlled by a mass flow controller (MFC) which may be heated to about 70 degrees C. In certain optional embodiments, oxygen ($O_2$) gas may be independently flowed through an MFC. The temperature of substrate 1 may be room temperature; an arc power of about 1000 W may be used; precursor gas flow may be about 25 sccm; the base pressure may be about $10^{-6}$ Torr. The optimal ion energy window for the majority of layers 2, 3 is from about 100–1,000 eV (preferably from about 100–400 eV) per carbon ion. At these energies, the carbon in the resulting layers 2, 3 emulates diamond, and $sp^3$ C—C bonds form. However, compressive stresses can develop in ta-C when being deposited at 100–150 eV. Such stress can reach as high as 10 GPa and can potentially cause delamination from many substrates. It has been found that these stresses can be controlled and decreased by using an ion energy during the deposition process in a range of from about 200–1,000 eV. As stated above, layers 2 and 3 intermix with one another at the interface between the two layers, thereby improving the bonding between the layers. At particle energies (carbon energies) of several hundred eV, a considerable material transport can take place over several atomic distances. This is caused by the penetration of fast ions and neutrals as well as by the recoil displacement of struck atoms. At sufficiently high particle energies and impact rates, there is an enhanced diffusion of the thermally agitated atoms near the film surface that occurs via the continuously produced vacancies. In the formation of ta-C:H, these effects can help improve film adhesion by broadening the interface (i.e., making it thicker, or making an interfacial layer between the two layers 2 and 3 (or between layer 2 and glass 1) due to atom mixing). After layer 2 is deposited, the carbon from layer 3 implants into layer 2 (i.e., subimplantation) so as to make the bond better of layer 3 to the substrate. Thus, layers 2 and 3 are contiguous due to this intermixing, and this "smearing" between the layers enhances the adhesion of layer 3 to both layer 2 and thus the substrate 1.

High stress is undesirable in the thin interfacing portion of layer 2 that directly contacts the surface of a glass substrate 1 in the FIG. 1 embodiment. Thus, for example, the first 1–40% thickness (preferably the first 1–20% and most preferably the first 5–10% thickness) of layer 2 may optionally be deposited on substrate 1 using high anti-stress energy levels of from about 200–1,000 eV, preferably from about 400–500 eV. Then, after this initial interfacing layer portion of layer 2 has been grown, the ion energy in the ion deposition process may be decreased (either quickly or gradually while deposition continues) to about 100–200 eV, preferably from about 100–150 eV, to grow the remainder of layer(s) 2 and/or layer(s) 3–4. Thus, in certain embodiments, because of the adjustment in ion energy and/or gases during the deposition process, DLC inclusive layers 2–4 may optionally have different densities and different percentages of $sp^3$ C—C bonds at different layer portions thereof (the lower the ion energy, the more $sp^3$ C—C bonds and the higher the density).

While direct ion beam deposition techniques are preferred in certain embodiments, other methods of deposition may also be used in different embodiments. For example, filtered cathodic vacuum arc ion beam techniques may be used to deposit layers 2–4. Also, in certain embodiments, $CH_4$ may be used as a feedstock gas during the deposition process instead of or in combination with the aforesaid $C_2H_2$ gas.

After layers 2-3 have been deposited, primer layer 4 is deposited in a manner similar to that described above for layer 2. However, in one particular example, the gases used in forming layer 4 may include in addition to the HMDSO and oxygen described above, argon (Ar) mixed with the oxygen gas in order to enable more $sp^3$ C—C bonds to be formed in layer 4 than in layer 2 so that layer 4 is harder than layer 2 (for durability purposes). The Ar/O mixture is preferably fed through the source via cavity 42 while the HMDSO gas is preferably inserted into the ion beam at 39, or alternatively may in addition or instead be caused to flow through the source at 42 along with the Ar/O gas mixture.

After DLC inclusive layers 2–4 have been formed on substrate 1, FAS inclusive layer 6 is deposited thereon or applied thereto as shown in FIG. 1 (e.g., by rubbing or otherwise applying/depositing this layer 6 in any other suitable manner). After FAS inclusive layer 6 has been formed on the substrate 1, the coated article is heated (e.g., at about 70–120 degrees C., or any other temperature mentioned above). Surprisingly, as mentioned previously, it has been found that heating the coated article in such a manner improves the durability of FAS inclusive layer 6, and thus of the overall coating system. It is thought that such hearing may "cure" layer 6 or otherwise cause it to more completely bond to itself and/or layer 4.

FIG. 8 is a flowchart illustrating certain steps taken in the manufacture of a hydrophobic coated article according to an embodiment of this invention. A substrate 1 (e.g., glass, plastic, or ceranic substrate) is provided at step 10. At least one DLC inclusive layer 2–4 is deposited on the substrate at step 11. Following formation of the DLC inclusive layer(s), an FAS compound inclusive layer is deposited on the substrate in step 12. The FAS inclusive layer is preferably deposited directly on the upper surface of a DLC inclusive layer or a primer layer in certain embodiments of this invention. After the DLC and FAS inclusive layers have been deposited on the substrate, the entire coated article (or alternatively only the FAS inclusive layer) is subjected to heating for curing purposes in step 13. The heating may take place in any suitable oven or furnace, or alternatively may be implemented by an IR or any other type of localized heating device. This heating may be at a temperature of from about 50 to 300 degrees C., more preferably at a temperature of from about 70 to 200 degrees C., and even more preferably at a temperature of from about 70–100 degrees C. However, it is noted that as the heating time goes up, the required temperature goes down. Thus, for purposes of example only, the heating may be conducted at about 80 degrees C. for about 60 minutes (1 hour). Alternatively, the heating may be conducted at about 250 degrees C. for about 5 minutes, or at about 150 degrees C. for about 20 minutes. The time which the coated article is subjected to heating may range from about 20 seconds to 2 hours in certain embodiments of this invention, more preferably from about one (1) minute to one (1) hour, depending on the temperature used. In preferred embodiments of this invention, at least the FAS inclusive layer (and preferably the entire coated article) is heated at a temperature and for a period of time sufficient to achieve one or more of the durability and/or hydrophobic properties discussed above.

As will be appreciated by those skilled in the art, coated articles according to different embodiments of this invention may be utilized in the context of automotive windshields, automotive side windows, automotive backlites (i.e., rear windows), architectural windows, residential windows, ceramic tiles, shower doors, and the like.

Once given the above disclosure, many other features, modifications, and improvements will become apparent to the skilled artisan. Such other features, modifications, and improvements are, therefore, considered to be a part of this invention, the scope of which is to be determined by the following claims. For example and without limitation, certain coated articles according to this invention may be hydrophobic, other coated articles according to this invention may be hydrophilic, and still other coated articles according to this invention may be neither hydrophobic nor hydrophilic.

What is claimed is:

1. A method of making a coated article, the method comprising:
    providing a substrate;
    depositing a first DLC inclusive layer on the substrate using a first gas including silicon (Si) such that the first DLC inclusive layer has an index of refraction "n" of from about 1.4 to 2.0;
    depositing a second DLC inclusive layer on the substrate over the first DLC inclusive layer using a second gas different than the first gas such that the second DLC inclusive layer has an index of refraction greater than the index of refraction of the first DLC inclusive layer, and wherein the second DLC inclusive layer has greater hardness and a greater ratio or percentage of $sp^3$ carbon-carbon bonds than the first DLC inclusive layer; and
    depositing a third DLC inclusive layer on the substrate over the second DLC inclusive layer using a gas including silicon (Si) such that the second DLC inclusive layer includes a greater percentage of $sp^3$ carbon-carbon bonds than the third DLC inclusive layer.

2. The method of claim 1, further comprising applying an FAS inclusive layer over the second and third DLC inclusive layers, the third DLC inclusive layer comprising at least one oxide.

3. The method of claim 1, wherein the first DLC inclusive layer is deposited on the substrate in a manner such that the first DLC inclusive layer has an index of refraction "n" with a value between respective indices of refraction "n" of the substrate and the second DLC inclusive layer.

4. The method of claim 3, wherein the first gas comprises at least one of tetramethyldisiloxane (TMDSO), tetraethoxylsilane (TEOS), hexamethyldisiloxane (HMDSO), octamethylcyclotetrasiloxane (OMCTSO), an ethoxy substituted silane, and an alkoxy substituted silane.

5. The method of claim 3, wherein the second gas comprises at least $C_2H_2$.

6. The method of claim 1, wherein the first gas includes at least one of a siloxane compound and an oxygen inclusive organosilicon compound, and wherein the second gas includes a hydrocarbon.

7. A method of making a coated article, the method comprising:
    providing a substrate;
    depositing a first DLC inclusive layer on the substrate using at least a first gas, the first gas including at least one of a siloxane and an oxygen inclusive organosilicon compound; and
    depositing a second DLC inclusive layer on the substrate over the first DLC inclusive layer using a second gas different than the first gas, in a manner such that the second DLC inclusive layer includes more $sp^3$ carbon-carbon bonds than the first DLC inclusive layer.

8. The method of claim 7, wherein the first DLC inclusive layer includes silicon (Si) and oxygen (O) in amounts such that the first DLC inclusive layer has an index of refraction "n" of from about 1.4 to 2.0, and wherein the second gas comprises a hydrocarbon.

9. The method of claim 7, wherein the steps of depositing the first and second DLC inclusive layers are performed in manners such that the first DLC inclusive layer includes more silicon (Si) and more oxygen (O) than the second DLC inclusive layer.

10. The method of claim 7, wherein the second gas comprises at least $C_2H_2$.

11. The method of claim 7, wherein the first gas comprises at least one of: tetramethyldisiloxane (TMDSO), tetraethoxylsilane (TEOS), hexamethyldisiloxane (HMDSO), octamethylcyclotetrasiloxane (OMCTSO), an ethoxy substituted silane, and an alkoxy substituted silane.

12. The method of claim 7, further comprising:
    depositing a primer layer including DLC and an oxide on the substrate in a location such that the first and second DLC inclusive layers are located between the primer layer and the substrate; and
    depositing an overlying layer on the substrate over the primer layer for increasing contact angle of the resulting coated article with a drop of water.

13. The method of claim 12, wherein the overlying layer comprises at least one fluoro-alkyl silane (FAS) compound.

14. The method of claim 13, wherein the FAS compound includes at least one of: $CF_3(CH_2)_2Si(OCH_3)_3$; $CF_3(CF_2)_5(CH_2)_2Si(OCH_2CH_3)_3$; $CF_3(CH_2)_2SiCl_3$; $CF_3((CF_2)_5(CH_2)_2$ $SiCl_3$; $CF_3(CF_2)_7(CH_2)_2Si(OCH_3)_3$; $CF_3(CF_2)_5(CH_2)_2Si(OCH_3)_3$; $CF_3(CD_2)_7(CH_2)_2SiCl_3$; $CF_3(CF_2)_7(CH_2)_2$ $SiCH_3Cl_2$; and $CF_3(CF_2)_7(CH_2)_2SiCH_3(OCH_3)_2$.

15. A method of making a coated article, the method comprising the steps of:
    providing a substrate;
    ion beam depositing a DLC inclusive layer on the substrate using at least a first gas including a hydrocarbon, wherein the DLC inclusive layer includes $sp^3$ carbon-carbon bonds; and
    ion beam depositing a primer layer on the substrate over the DLC inclusive layer using at least a second gas, the second gas being different than the first gas, the second gas including at least one of a siloxane and an oxygen inclusive organosilicon compound.

16. The method of claim 15, further comprising the step of depositing a hydrophobic layer on the substrate over the primer layer.

17. The method of claim 16, wherein the hydrophobic layer includes at least one FAS compound and is in direct contact with the primer layer.

18. The method of claim 15, further comprising ion beam depositing an anti-reflection layer including DLC directly on the substrate so as to contact the substrate, wherein the anti-reflection layer is at a location such that the anti-reflection layer is between the substrate and the DLC inclusive layer, and the DLC inclusive layer is between the anti-reflection layer and the primer layer.

* * * * *